US012660699B2

(12) United States Patent (10) Patent No.: US 12,660,699 B2
Ma et al. (45) Date of Patent: Jun. 16, 2026

(54) PACKAGE STRUCTURE OF BIDIRECTIONAL SWITCH, SEMICONDUCTOR DEVICE, AND POWER CONVERTER

(71) Applicant: Huawei Digital Power Technologies Co., Ltd., Shenzhen (CN)

(72) Inventors: Zheng Ma, Xi'an (CN); Dong Chen, Shanghai (CN); Xiaofeng Yao, Shenzhen (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 545 days.

(21) Appl. No.: 18/186,399

(22) Filed: Mar. 20, 2023

(65) Prior Publication Data

US 2023/0327567 A1 Oct. 12, 2023

(30) Foreign Application Priority Data

Mar. 23, 2022 (CN) .......................... 202210289620.6

(51) Int. Cl.
H02M 7/487 (2007.01)
H10W 90/00 (2026.01)

(52) U.S. Cl.
CPC .......... H10W 90/00 (2026.01); H10W 90/811 (2026.01); *H02M 7/487* (2013.01)

(58) Field of Classification Search
None
See application file for complete search history.

(56) References Cited

U.S. PATENT DOCUMENTS

| | | | | |
|---|---|---|---|---|
| 11,894,839 B2 * | 2/2024 | Masuda | .................. | H01L 25/18 |
| 2006/0043545 A1 * | 3/2006 | Yea | .................... | H01L 23/49575 |
| | | | | 257/666 |
| 2010/0213510 A1 * | 8/2010 | Osawa | .................... | H01L 24/49 |
| | | | | 257/E29.166 |
| 2015/0115313 A1 * | 4/2015 | Otremba | ................. | H01L 24/49 |
| | | | | 257/124 |
| 2018/0006639 A1 * | 1/2018 | Sander | .................... | H01L 24/49 |
| 2023/0197582 A1 * | 6/2023 | Otremba | ........... | H01L 23/49537 |
| | | | | 257/76 |

FOREIGN PATENT DOCUMENTS

| | | |
|---|---|---|
| CN | 101211904 A | 7/2008 |
| CN | 201478306 U | 5/2010 |
| CN | 108122898 A | 6/2018 |

* cited by examiner

*Primary Examiner* — Sisay G Tiku
(74) *Attorney, Agent, or Firm* — Maier & Maier, PLLC

(57) ABSTRACT

A package structure of a bidirectional switch, including a metal bottom plate, a first semiconductor switch, a second semiconductor switch, and a plurality of inner pins. The plurality of inner pins includes a first inner pin, a second inner pin, a third inner pin, a fourth inner pin, and a fifth inner pin. Both a first terminal of the first semiconductor switch and a first terminal of the second semiconductor switch are coupled to the metal bottom plate. A second terminal of the first semiconductor switch is coupled to the first inner pin. A third terminal of the first semiconductor switch is coupled to the second inner pin. A second terminal of the second semiconductor switch is coupled to the third inner pin. A third terminal of the second semiconductor switch is coupled to the fourth inner pin. Each inner pin is coupled to a same lead frame.

17 Claims, 16 Drawing Sheets

541  542    544  543

1041   1042         1044   1043

1041  1042    1044  1043

...

1041  1042    1044  1043

541
546  542  544  547  543  545

545

541  546  542  544  547  543

541    543
546  542    544  547

541
546  542  544  547  543

541　546　542　544　547　543

PACKAGE STRUCTURE OF BIDIRECTIONAL SWITCH, SEMICONDUCTOR DEVICE, AND POWER CONVERTER

CROSS-REFERENCE TO RELATED APPLICATION

This application claims priority to Chinese Patent Application No. 202210289620.6, filed on Mar. 23, 2022, which is hereby incorporated by reference in its entirety.

TECHNICAL FIELD

The embodiments relate to the field of semiconductor technologies, a package structure of a bidirectional switch, a semiconductor device, and a power converter.

BACKGROUND

For a circuit diagram of a bidirectional switch, refer to FIG. 1. As shown in FIG. 1, the bidirectional switch includes a semiconductor switch $Q_{11}$ and a semiconductor switch $Q_{12}$. For example, when the semiconductor switch $Q_{11}$ is turned off and the semiconductor switch $Q_{12}$ is turned on, a current may flow from a parasitic diode of the semiconductor switch $Q_{11}$ through the semiconductor switch $Q_{12}$, and a current flow direction may be understood as a first direction (that is, left-in and right-out). When the semiconductor switch $Q_{11}$ is turned on and the semiconductor switch $Q_{12}$ is turned off, a current may flow from a parasitic diode of the semiconductor switch $Q_{12}$ through the semiconductor switch $Q_{11}$, and a current flow direction may be understood as a second direction (that is, right-in and left-out). In other words, the bidirectional switch is a switch that can allow a current to flow bidirectionally.

The bidirectional switch in the conventional technology may be implemented as two discrete semiconductor devices. In this case, for a schematic diagram of a package structure of the bidirectional switch, refer to FIG. 2. As shown in FIG. 2, regardless of whether the current flow direction is the first direction or the second direction, the current needs to pass through a pin $S_{11}$, a thin metal wire (Wire Bonding) 111, a pin $D_{11}$, printed circuit board (PCB) wiring 13, a pin $D_{12}$, a thin metal wire 121, and a pin $S_{12}$. It can be learned that, in the package structure of the bidirectional switch provided in the conventional technology, stray inductance of a current loop includes inductance brought by four pins, two sections of thin metal wires, and one section of PCB wiring, and the stray inductance is relatively large.

SUMMARY

The embodiments may provide a package structure of a bidirectional switch, a semiconductor device, and a power converter, so as to reduce stray inductance of a current loop of the bidirectional switch.

According to a first aspect, an embodiment may provide a package structure of a bidirectional switch. The package structure includes a metal bottom plate, a first semiconductor switch, a second semiconductor switch, and a plurality of inner pins. The plurality of inner pins may include a first inner pin, a second inner pin, a third inner pin, a fourth inner pin, and a fifth inner pin.

In an implementation, the first semiconductor switch and the second semiconductor switch are disposed on the metal bottom plate, and both a first terminal of the first semiconductor switch and a first terminal of the second semiconductor switch are coupled to the metal bottom plate; a second terminal of the first semiconductor switch is coupled to the first inner pin; a third terminal of the first semiconductor switch is coupled to the second inner pin; a second terminal of the second semiconductor switch is coupled to the third inner pin; a third terminal of the second semiconductor switch is coupled to the fourth inner pin; and the metal bottom plate is coupled to the fifth inner pin. In this embodiment, stray inductance of a current loop of the bidirectional switch may include inductance brought by the second inner pin, a second outer pin coupled to the second inner pin, the fourth inner pin, a fourth outer pin coupled to the fourth inner pin, and two sections of thin metal wires. The second inner pin and the second outer pin are integrally formed, and the fourth inner pin and the fourth outer pin are integrally formed. That is, stray inductance of the current loop of the bidirectional switch in this embodiment may include inductance brought by two pins (each pin includes an inner pin and an outer pin) and two sections of thin metal wires. Compared with the conventional technology, inductance brought by two pins (each pin includes an inner pin and an outer pin) and one section of PCB wiring is deducted from the stray inductance of the current loop. That is, the package structure of the bidirectional switch provided in this embodiment can reduce the stray inductance of the current loop of the bidirectional switch.

In addition, each of the plurality of inner pins in this embodiment may be coupled to a same lead frame. In this embodiment, a package process of the lead frame may be used and the metal bottom plate and all the inner pins may be a part of the same lead frame, so that processing is convenient, and production efficiency is high. In addition, the package process of the lead frame is low in costs. This can improve production efficiency and reduce production costs.

With reference to the first aspect, in a first possible implementation, the package structure further includes a first diode and a second diode. The first diode and the second diode are disposed on the metal bottom plate, and both a cathode of the first diode and a cathode of the second diode are coupled to the metal bottom plate; and an anode of the first diode is coupled to the second inner pin, and an anode of the second diode is coupled to the fourth inner pin. In this embodiment, the package structure may be implemented as a package structure of an insulated gate bipolar transistor (IGBT) and a diode anti-parallel connected to the insulated gate bipolar transistor.

With reference to the first aspect or with reference to the first possible implementation of the first aspect, in a second possible implementation, the package structure further includes outer pins that are in a one-to-one correspondence with the inner pins; and any inner pin is coupled to an outer pin corresponding to the any inner pin. In an implementation, a package housing is formed by plastically packaging the metal bottom plate and all of the plurality of inner pins by using a plastic package material, all of the plurality of inner pins are covered by the package housing, and the outer pins that are in a one-to-one correspondence with the inner pins are exposed outside the package housing.

With reference to the first aspect or with reference to the first possible implementation of the first aspect, in a third possible implementation, the package structure further includes a first outer pin coupled to the first inner pin, a second outer pin coupled to the second inner pin, a third outer pin coupled to the third inner pin, and a fourth outer pin coupled to the fourth inner pin. A package housing is formed by plastically packaging the metal bottom plate and all of the plurality of inner pins by using a plastic package material, and the first inner pin, the second inner pin, the third inner pin, the fourth inner pin, and the fifth inner pin are all covered by a package housing; and the first outer pin, the second outer pin, the third outer pin, and the fourth outer pin are exposed outside the package housing. In addition, a cutting surface of the fifth inner pin is formed after a part that is of the fifth inner pin and that exceeds the package housing is cut off, and the cutting surface of the fifth inner pin is exposed outside the package housing. In this embodiment, the part (that is, the fifth outer pin) that is of the fifth inner pin and that exceeds the package housing may be cut off, so that in the bidirectional switch semiconductor device provided in this embodiment, the fifth pin may not need to be welded on a PCB board, and during PCB wiring, safety avoidance between the fifth outer pin and the second outer pin or between the fifth outer pin and the fourth outer pin may not need to be considered to facilitate PCB wiring.

With reference to the first aspect or with reference to any one of the foregoing possible implementations of the first aspect, in a fourth possible implementation, the plurality of inner pins may further include a sixth inner pin and a seventh inner pin, and the package structure further includes a sixth outer pin coupled to the sixth inner pin and a seventh outer pin coupled to the seventh inner pin. The third terminal of the first semiconductor switch is further coupled to the sixth inner pin; and the third terminal of the second semiconductor switch is further coupled to the seventh inner pin. The package housing is formed by plastically packaging the metal bottom plate and all of the plurality of inner pins by using the plastic package material, the sixth inner pin and the seventh inner pin are both covered by the package housing, and the sixth outer pin and the seventh outer pin are both exposed outside the package housing. In this embodiment, pins may be added to the package structure of the bidirectional switch, so that the bidirectional switch can implement a Kelvin connection method, and a control loop may be decoupled from a power loop, so that a switching speed of the semiconductor switch is increased.

With reference to the first aspect or with reference to any one of the foregoing possible implementations of the first aspect, in a fifth possible implementation, each of the plurality of inner pins is disposed along a first side surface of the metal bottom plate.

With reference to the first aspect or with reference to any one of the foregoing possible implementations of the first aspect, in a sixth possible implementation, other inner pins than the fifth inner pin in the plurality of inner pins are disposed along a first side surface of the metal bottom plate, and the fifth inner pin is disposed along a second side surface of the metal bottom plate, where the first side surface is adjacent to the second side surface.

With reference to the first aspect or with reference to any one of the foregoing possible implementations of the first aspect, in a seventh possible implementation, other inner pins than the fifth inner pin in the plurality of inner pins are disposed along a first side surface of the metal bottom plate, and the fifth inner pin is disposed along a third side surface of the metal bottom plate, where the first side surface is opposite to the third side surface.

With reference to the first aspect or with reference to any one of the foregoing possible implementations of the first aspect, in an eighth possible implementation, pin widths of the first inner pin and the third inner pin are less than pin widths of the fifth inner pin, the second inner pin, and the fourth inner pin.

According to a second aspect, an embodiment may provide a bidirectional switch semiconductor device. The semiconductor device includes a package housing and a chip having the package structure described with reference to the first aspect or with reference to any one of the possible implementations of the first aspect, and some of pins of the chip are exposed outside the package housing.

According to a third aspect, an embodiment may provide a power converter. The power converter includes a controller and the semiconductor device in the second aspect. The controller may control turn-on or turn-off of the semiconductor device to perform power conversion.

It should be understood that, for implementations and beneficial effects of the foregoing aspects of this application, reference may be made to each other.

DETAILED DESCRIPTION OF THE EMBODIMENTS

The following clearly and describes the embodiments with reference to the accompanying drawings. It is clear that the described embodiments are some but not all of the embodiments. All other embodiments obtained by a person of ordinary skill in the art without creative efforts shall fall within the scope of the embodiments.

The implementations are further described below in detail with reference to the accompanying drawings.

A bidirectional switch semiconductor device provided in the embodiments may be applicable to a scenario in which a current flows bidirectionally, for example, may be applicable to a power converter such as an Alternating Current/Direct Current (AC/DC) converter or a Direct Current/Alternating Current (DC/AC) converter.

Figure 1:
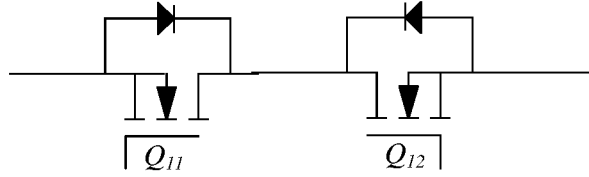
FIG. 1 is a schematic diagram of a circuit of a bidirectional switch.
Figure 2:
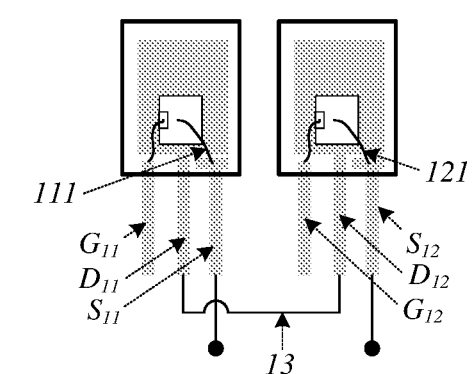
FIG. 2 is a schematic diagram of a package structure of a bidirectional switch provided in a conventional technology.
Figure 3A:
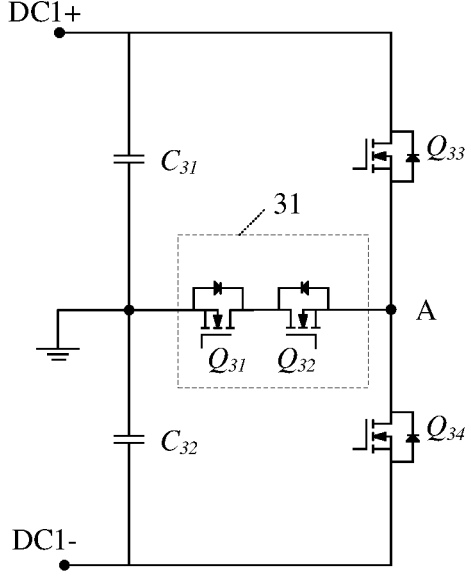
FIG. 3A is a schematic diagrams of a circuit of a power converter according to an embodiment.

In some feasible implementations, FIG. 3A is a schematic diagram of a circuit of a power converter according to an embodiment. As shown in FIG. 3A, the power converter includes a capacitor $C_{31}$, a capacitor $C_{32}$, a semiconductor device 31, a semiconductor switch $Q_{33}$, a semiconductor switch $Q_{34}$, and a controller (not shown in the figure).

A semiconductor switch $Q_{31}$ and a semiconductor switch $Q_{32}$ are integrated in the semiconductor device 31. A first terminal (that is, a drain) of the semiconductor switch $Q_{31}$ is coupled to a first terminal (that is, a drain) of the semiconductor switch $Q_{32}$. It may be understood that, the two semiconductor switches in the semiconductor device 31 may be implemented as one integrated semiconductor device. This is different from that two semiconductor switches are respectively implemented as two discrete semiconductor devices in the conventional technology.

It should be noted that "coupling" may mean either a direct or an indirect connection. For example, that a is coupled to b may mean that a is directly connected to b, or that a is indirectly connected to b by using one or more other electrical elements. For example, a is directly connected to c, and c is directly connected to b, so that a is connected to b by using c.

The controller may control turn-on or turn-off of the semiconductor device 31, the semiconductor switch $Q_{33}$, and the semiconductor switch $Q_{34}$, to perform power conversion. In an implementation, the controller may be a micro control unit (MCU), a central processing unit (CPU), another general-purpose processor, a digital signal processor (DSP), an application-specific integrated circuit (ASIC), a field-programmable gate array (FPGA) or another programmable logic device, a discrete gate or transistor logic device, a discrete hardware component, or the like.

It should be noted that, the power converter may have one or more controllers, that is, the semiconductor switch and the semiconductor device may share a controller or may be controlled by different controllers having a communication connection between the controllers. In other words, a quantity of controllers in the power converter is not limited in the embodiments.

In this case, the power converter shown in FIG. 3A may convert a direct current (for example, DC1+ and DC1−) into an alternating current, and output the alternating current at a point A. For an implementation of the power converter, refer to implementation of a T-type three-level circuit in the DC/AC converter, and details are not described herein again.

Different from the conventional technology, the power converter provided in the embodiments may use a bidirectional switch semiconductor device, that is, the bidirectional switch of the power converter may be implemented as an integrated semiconductor device, so that a board area occupied by the power converter on a PCB board can be reduced.

In addition, in the conventional technology, a heat dissipation measure for a power converter is: coating an auxiliary material such as thermally conductive silicone grease on a bottom of each semiconductor device, and then placing a ceramic substrate on the bottom coated with the auxiliary material such as thermally conductive silicone grease. Because one bidirectional switch has two discrete semiconductor devices in the conventional technology, two semiconductor devices need to be coated, and two ceramic substrates are required. However, the bidirectional switch may be implemented as one integrated semiconductor device, and use of an auxiliary material such as thermally conductive silicone grease and a ceramic substrate can be reduced, so that use costs of the power converter are reduced.

In the power converter shown in FIG. 3A, that the semiconductor switch is a metal-oxide-semiconductor field-effect transistor (MOSFET) is used as an example. It may be understood that, the semiconductor switch may also be implemented as an insulated gate bipolar transistor (IGBT) and a diode anti-parallel connected to the insulated gate bipolar transistor. In some feasible implementations, the semiconductor switch in FIG. 3A may be replaced with an IGBT from an MOSFET, so as to obtain a power converter shown in FIG. 3B.

Figure 3B:
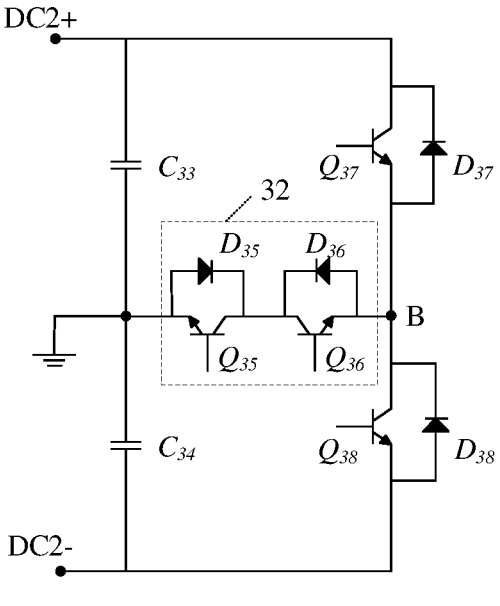
FIG. 3B is a schematic diagrams of a circuit of a power converter according to an embodiment.

As shown in FIG. 3B, the power converter includes a capacitor $C_{33}$, a capacitor $C_{34}$, a semiconductor device 32, a semiconductor switch $Q_{37}$, a diode $D_{37}$, a semiconductor switch $Q_{38}$, a diode $D_{38}$, and a controller (not shown in the figure).

Because the IGBT does not have a parasitic diode, when the semiconductor switch may be implemented as an IGBT, a diode is connected in parallel between a first terminal (that is, a collector) of each IGBT and a third terminal (that is, an emitter) of the IGBT. In other words, different from the semiconductor device 31 shown in FIG. 3A, the semiconductor device 32 shown in FIG. 3B further integrates the diode $D_{35}$ and the diode $D_{36}$ in addition to the semiconductor switch $Q_{35}$ and the semiconductor switch $Q_{36}$. A collector of the semiconductor switch $Q_{35}$ is coupled to a cathode of the diode $D_{35}$, a collector of the semiconductor switch $Q_{36}$, and a cathode of the diode $D_{36}$, an anode of the diode $D_{35}$ is coupled to an emitter of the semiconductor switch $Q_{35}$, and an anode of the diode $D_{36}$ is coupled to an emitter of the semiconductor switch $Q_{36}$.

In this case, the semiconductor device 32 may still be implemented as one integrated semiconductor device. This is different from that two semiconductor switches are respectively implemented as two discrete semiconductor devices in the conventional technology. In this case, the power converter shown in FIG. 3B may convert a direct current (for example, DC2+ and DC2−) into an alternating current, and output the alternating current at a point B. For an implementation of the power converter, also refer to implementation of the T-type three-level circuit in the DC/AC converter, and details are not described herein again.

Figure 4A:
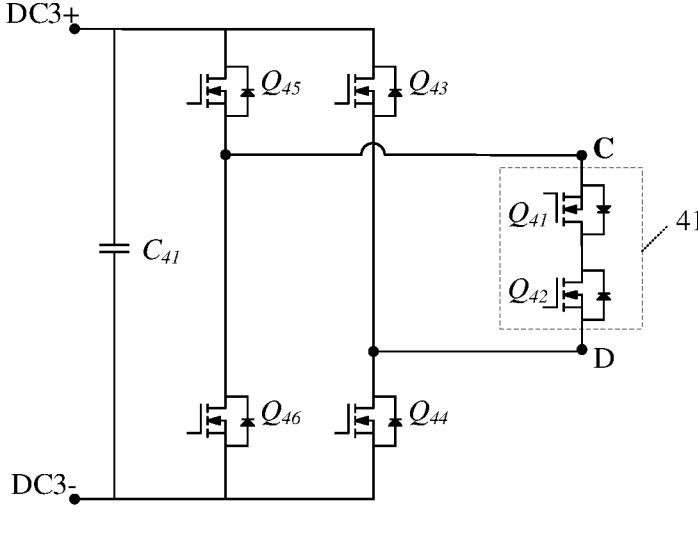
FIG. 4A is a schematic diagrams of a circuit of a power converter according to an embodiment.

In some feasible implementations, FIG. 4A is a schematic diagram of another circuit of a power converter according to an embodiment. As shown in FIG. 4A, the power converter includes a capacitor $C_{41}$, a semiconductor device 41, a semiconductor switch $Q_{43}$, a semiconductor switch $Q_{44}$, a semiconductor switch $Q_{45}$, a semiconductor switch $Q_{46}$, and a controller (not shown in the figure).

A semiconductor switch $Q_{41}$ and a semiconductor switch $Q_{42}$ are integrated in the semiconductor device 41. A first terminal (that is, a drain) of the semiconductor switch $Q_{41}$ is coupled to a first terminal (that is, a drain) of the semiconductor switch $Q_{42}$. It may be understood that, the two semiconductor switches integrated in the semiconductor device 41 may be implemented as one integrated semiconductor device. This is different from that two semiconductor switches are respectively implemented as two discrete semiconductor devices in the conventional technology.

In this case, the power converter shown in FIG. 4A may convert a direct current (for example, DC3+ and DC3−) into an alternating current, and output the alternating current between a point C and a point D. For an implementation of the power converter, refer to implementation of a Heric (HERIC) topology, and details are not described herein again.

Optionally, three power converters shown in FIG. 4A may be connected in parallel and combined to form a three-phase inverter, and the three-phase inverter may be applied to photovoltaic, electric vehicle, and other scenarios.

Figure 4B:
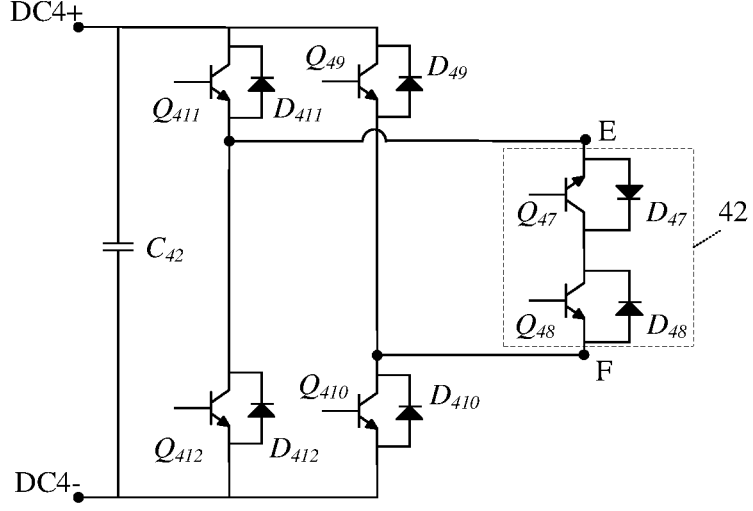

Similarly, in some feasible implementations, the semiconductor switch in FIG. 4A may be replaced with an IGBT from an MOSFET, so as to obtain a power converter shown in FIG. 4B.

As shown in FIG. 4B, the power converter includes a capacitor $C_{42}$, a semiconductor device 42, a semiconductor switch $Q_{49}$, a diode $D_{49}$, a semiconductor switch $Q_{410}$, a diode $D_{410}$, a semiconductor switch $Q_{411}$, a diode $D_{411}$, a semiconductor switch $Q_{412}$, a diode $D_{412}$, and a controller (not shown in the figure).

Because the IGBT does not have a parasitic diode, when the semiconductor switch may be implemented as an IGBT, a diode is connected in parallel between a first terminal (that is, a collector) of each IGBT and a third terminal (that is, an emitter) of the IGBT. In other words, different from the semiconductor device 41 shown in FIG. 4A, the semiconductor device 42 shown in FIG. 4B further integrates the diode $D_{47}$ and the diode $D_{48}$ in addition to the semiconductor switch $Q_{47}$ and the semiconductor switch $Q_{48}$. A collector of the semiconductor switch $Q_{47}$ is coupled to a cathode of the diode $D_{47}$, a collector of the semiconductor switch $Q_{48}$, and a cathode of the diode $D_{48}$, an anode of the diode $D_{47}$ is coupled to an emitter of the semiconductor switch $Q_{47}$, and an anode of the diode $D_{48}$ is coupled to an emitter of the semiconductor switch $Q_{48}$.

In this case, the semiconductor device 42 may still be implemented as one integrated semiconductor device. This is different from that two semiconductor switches are respectively implemented as two discrete semiconductor devices in the conventional technology. The power converter shown in FIG. 4B may convert a direct current (for example, DC4+ and DC4−) into an alternating current, and output the alternating current between a point E and a point F. For an implementation of the power converter, also refer to implementation of a Heric (HERIC) topology, and details are not described herein again.

Similarly, three power converters shown in FIG. 4B may also be connected in parallel and combined to form a three-phase inverter, and the three-phase inverter may be applied to photovoltaic, electric vehicle, and other scenarios.

The foregoing description with reference to FIG. 3A to FIG. 4B should be understood as an example of description of an application circuit of the bidirectional switch semiconductor device, and should not be construed as a limitation. In another AC/DC converter and another DC/DC converter, the bidirectional switch semiconductor device provided in the embodiments may still be used.

The following describes, with reference to the accompanying drawings, a package structure of the bidirectional switch semiconductor device provided in the embodiments.

Figure 5:
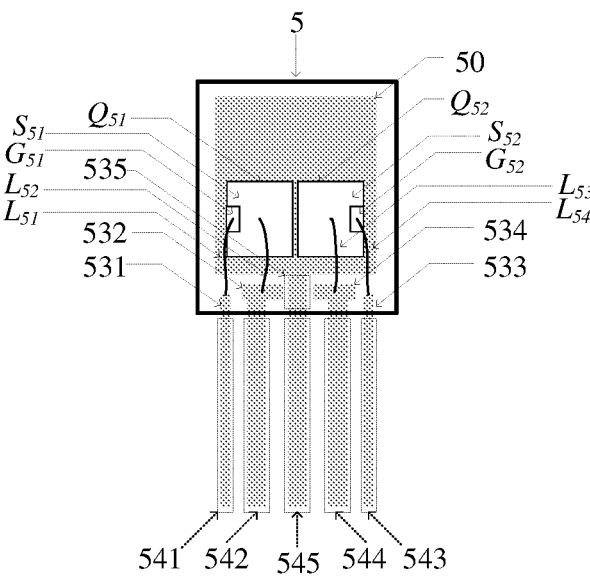
FIG. 5 is a schematic diagram of a package structure of a bidirectional switch according to an embodiment.

FIG. 5 is a schematic diagram of a package structure of a bidirectional switch according to an embodiment. As shown in FIG. 5, the package structure of the bidirectional switch includes a metal bottom plate 50, a first semiconductor switch $Q_{51}$, a second semiconductor switch $Q_{52}$, and a plurality of inner pins (for example, a first inner pin 531, a second inner pin 532, a third inner pin 533, a fourth inner pin 534, and a fifth inner pin 535). The metal bottom plate 50 may be implemented as a copper alloy, for example, an alloy such as copper-iron-phosphorus, copper-nickel-silicon, copper-chromium-zirconium, copper-silver, or copper-tin.

Wafers of the semiconductor switches are disposed on the metal bottom plate 50. That is, the first semiconductor switch $Q_{51}$ and the second semiconductor switch $Q_{52}$ are disposed on the metal bottom plate 50. In an implementation, the first terminal (that is, a drain) of the first semiconductor switch $Q_{51}$ and the first terminal (that is, a drain) of the second semiconductor switch $Q_{52}$ are disposed on the metal bottom plate 50. Because the metal bottom plate is conductive, the drain of the first semiconductor switch $Q_{51}$ may be coupled to the drain of the second semiconductor switch $Q_{52}$ by using the metal bottom plate 50.

It should be noted that, the semiconductor switch in the package structure of the bidirectional switch may be implemented as an MOSFET, and the semiconductor device having the package structure shown in FIG. 5 is the semiconductor device 31 in FIG. 3A and the semiconductor device 41 in FIG. 4A.

The second terminal $G_{51}$ (that is, a gate) of the first semiconductor switch $Q_{51}$ is coupled to the first inner pin 531 by using a thin metal wire $L_{51}$; and the third terminal $S_{51}$ (that is, a source) of the first semiconductor switch $Q_{51}$ is coupled to the second inner pin 532 by using a thin metal wire $L_{52}$. The second terminal $G_{52}$ (that is, a gate) of the second semiconductor switch $Q_{52}$ is coupled to the third inner pin 533 by using a thin metal wire $L_{54}$; and the third terminal $S_{52}$ (that is, a source) of the second semiconductor switch $Q_{52}$ is coupled to the fourth inner pin 534 by using a thin metal wire $L_{53}$. In addition, the metal bottom plate 50 is coupled to the fifth inner pin 535.

For example, the thin metal wire in this embodiment may be implemented as a gold wire, a silver wire, a copper wire, or an aluminum wire. It should be noted that, a quantity of thin metal wires described in this embodiment may be greater than 1. The thin metal wire $L_{52}$ is used as an example. In this embodiment, there may be a plurality of thin metal wires (not shown in the figure) connected in parallel to the thin metal wire $L_{52}$, to couple the source of the first semiconductor switch $Q_{51}$ to the second inner pin 532, so that a current flowing through the thin metal wire $L_{52}$ can be shunted, to adapt to an application scenario of a large current.

The package structure of the bidirectional switch further includes outer pins that are in a one-to-one correspondence with the inner pins, and any inner pin is coupled to an outer pin corresponding to the any inner pin. For example, the first inner pin 531 is coupled to a first outer pin 541, the second inner pin 532 is coupled to a second outer pin 542, the third inner pin 533 is coupled to a third outer pin 543, the fourth inner pin 534 is coupled to a fourth outer pin 544, and the fifth inner pin 535 is coupled to a fifth outer pin 545.

Different from the conventional technology in which the bidirectional switch may be implemented as two discrete semiconductor devices, the bidirectional switch in this embodiment may be implemented as an integrated semiconductor device. In this case, a current may pass through the second outer pin 542, the second inner pin 532, the thin metal wire $L_{52}$, the fourth outer pin 544, the fourth inner pin 534, and the thin metal wire $L_{53}$. The second outer pin 542 and the second inner pin 532 are integrally formed into one pin, and the fourth outer pin 544 and the fourth inner pin 534 are integrally formed into one pin.

In other words, in this embodiment, stray inductance of a current loop of the bidirectional switch includes inductance brought by two pins (each pin includes an inner pin and an outer pin) and two sections of thin metal wires. Compared with the conventional technology, inductance brought by two pins (each pin includes an inner pin and an outer pin) and one section of PCB wiring is deducted from the stray inductance of the current loop. That is, the package structure of the bidirectional switch provided in this embodiment can reduce the stray inductance of the current loop of the bidirectional switch.

In some feasible implementations, a package housing 5 is formed by plastically packaging the metal bottom plate 50 and all of the plurality of inner pins by using a plastic package material (for example, plastic package is performed by using epoxy resin). In this case, all the inner pins (that is, the first inner pin 531, the second inner pin 532, the third inner pin 533, the fourth inner pin 534, and the fifth inner pin 535) are covered by the package housing 5, and the outer pins (that is, the first outer pin 541, the second outer pin 542, the third outer pin 543, the fourth outer pin 544, and the fifth outer pin 545) in a one-to-one correspondence with the inner pins are all exposed outside the package housing 5.

Therefore, in a product form, the bidirectional switch semiconductor device provided in this embodiment has at least five outer pins.

Figure 6:
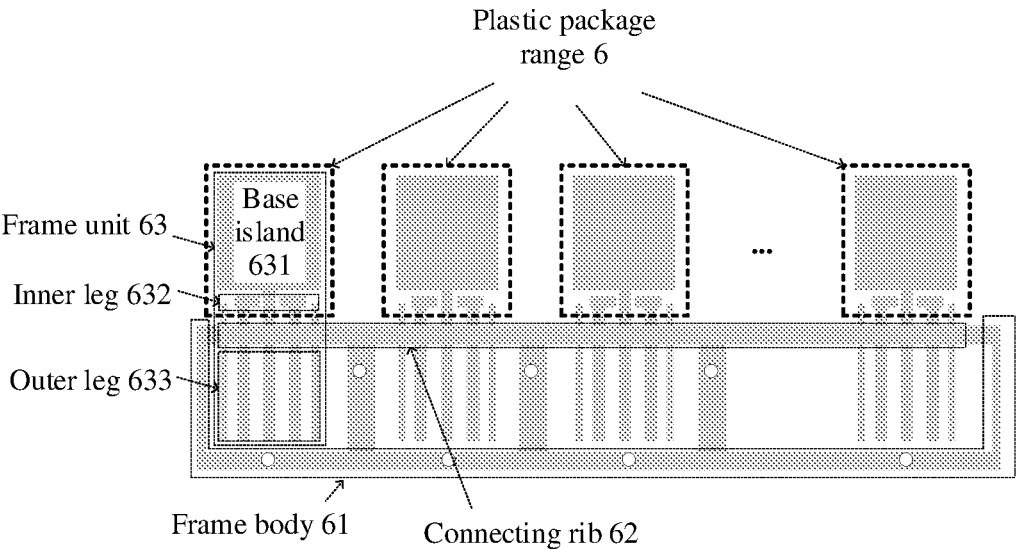
FIG. 6 is a schematic diagram of a structure of a lead frame corresponding to package structure of a bidirectional switch according to an embodiment.

For a lead frame on which the bidirectional switch semiconductor device is carried, refer to FIG. 6. FIG. 6 is a schematic diagram of a structure of a lead frame corresponding to package structure of a bidirectional switch according to an embodiment.

As shown in FIG. 6, the lead frame includes a frame body 61, connecting ribs 62, and a plurality of frame units 63. The frame body 61 may connect the frame units as a whole. Each frame unit 63 includes a base island 631, inner legs 632, and outer legs 633. Optionally, the base island 631 may be considered as the metal bottom plate 50 described above with reference to FIG. 5, or the metal bottom plate 50 described above with reference to FIG. 5 is obtained after the base island 631 is plated with gold or silver.

In a package process of the lead frame, wafers of the first semiconductor switch and the second semiconductor switch are welded in the base island 631 of each frame unit 63, so that the first semiconductor switch $Q_{51}$ and the second semiconductor switch $Q_{52}$ are disposed on the metal bottom plate 50.

The wafers are connected to the inner legs 632 by using thin metal wires (that is, wire bonding). In this case, the inner legs 632 in the frame unit 63 are the inner pins described above with reference to FIG. 5, or the inner pins described above with reference to FIG. 5 are obtained after the inner legs 632 are plated with gold or silver. That is, after wire bonding in the lead frame is performed, the package structure of the bidirectional switch shown in FIG. 5 may be obtained. Each inner pin in the package structure of the bidirectional switch is coupled to a same lead frame. Each inner pin may be coupled to the connecting rib 62 by using a corresponding outer leg 633. The outer leg 633 is the outer pin described above with reference to FIG. 5, or the outer pin described above with reference to FIG. 5 is obtained after the outer leg 633 is plated with gold or silver. In this case, the metal bottom plate and all the inner pins form a part of the same lead frame.

A plastic package of the lead frame may be packaging the metal bottom plate 50 and all the plurality of inner pins by using a plastic package material (for example, epoxy resin) in a plastic package range 6.

Figure 7A:
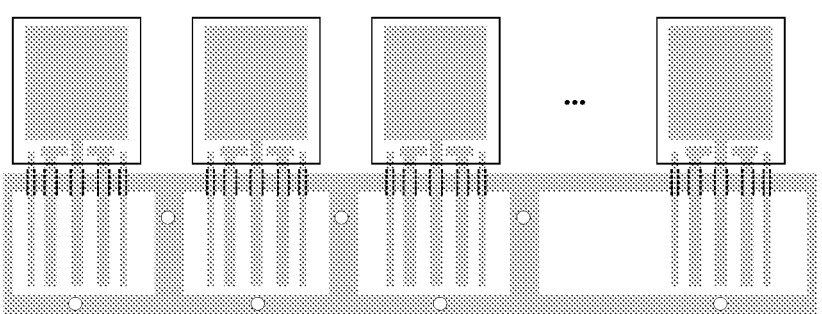
FIG. 7A is a schematic diagram of cropping of a lead frame according to an embodiment.

The lead frame is plastically packaged, and after the epoxy resin is solidified, the connecting ribs between the outer pins are cut off. In this case, refer to FIG. 7A. FIG. 7A is a schematic diagram of cropping of a lead frame according to an embodiment. As shown in FIG. 7A, a plurality of bidirectional switch semiconductor devices shown in FIG. 7B may be obtained by cutting off the connecting ribs along the dashed lines in FIG. 7A.

Figure 7B:
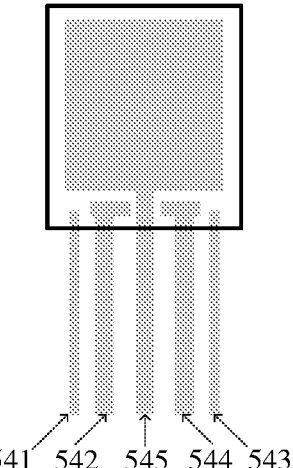
FIG. 7B is a schematic diagram of a bidirectional switch semiconductor device obtained after cropping is performed based on FIG. 7A according to an embodiment.

It may be understood that, FIG. 7B is a schematic diagram of the bidirectional switch semiconductor device after plastic package is performed, and therefore the wafers and the thin metal wires inside the semiconductor device cannot be seen. For example, the semiconductor device shown in FIG. 7B may be viewed by using a method such as an X-ray, and the wafers and the thin metal wires shown in FIG. 5 may be seen.

In conclusion, in this embodiment, a package process of the lead frame is used, and the metal bottom plate and all pins (each pin includes an inner pin and an outer pin) are a part of the same lead frame, so that processing is convenient, and production efficiency is high. In addition, the package process of the lead frame is low in costs. This can improve production efficiency and reduce production costs.

It should be noted that, FIG. 7A and FIG. 7B should be understood as examples of positions at which the inner pins are disposed in the package structure of the bidirectional switch, and should not be construed as a limitation.

For example, in FIG. 7A and FIG. 7B, each inner pin is disposed along a first side surface of the metal bottom plate, that is, all the inner pins are located on a same side of the metal bottom plate. For another example, the fifth inner pin 535 may be located at a different side of the metal bottom plate from the first inner pin 531, the second inner pin 532, the third inner pin 533, and the fourth inner pin 534.

Figure 8A:
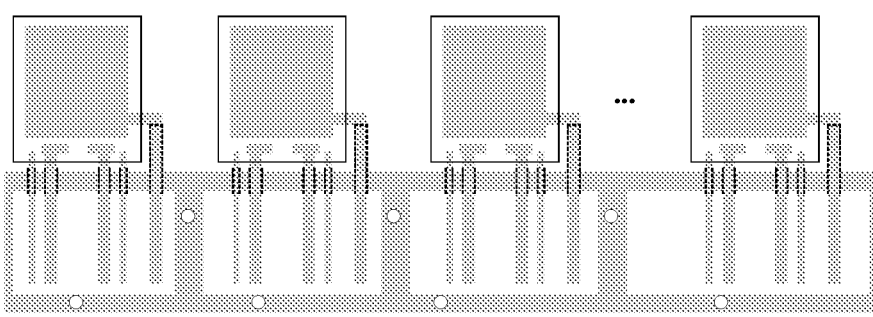
FIG. 8A is another schematic diagram of cropping of a lead frame according to an embodiment.

Optionally, in some feasible implementations, FIG. 8A is another schematic diagram of cropping of a lead frame according to an embodiment. As shown in FIG. 8A, a difference between a package structure (not shown in the figure) of the bidirectional switch and the package structure shown in FIG. 5 lies in that the fifth inner pin 535 is disposed at different positions. In this case, other inner pins (that is, the first inner pin 531, the second inner pin 532, the third inner pin 533, and the fourth inner pin 534) than the fifth inner pin 535 are disposed along the first side surface of the metal bottom plate, and the fifth inner pin 535 is disposed along the second side surface of the metal bottom plate. The first side surface is adjacent to the second side surface.

It should be noted that, FIG. 8A shows that the second side surface is on the left of the first side surface. Actually, the second side surface may be on the right of the first side surface (not shown in the figure).

Figure 8B:
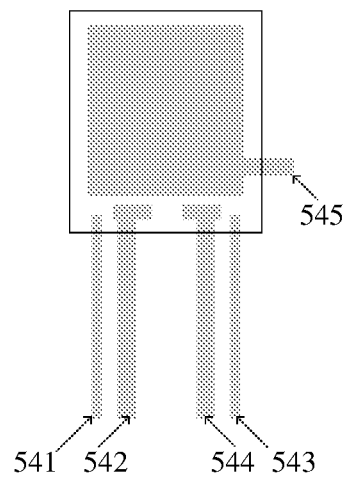
FIG. 8B is a schematic diagram of a bidirectional switch semiconductor device obtained after cropping is performed based on FIG. 8A according to an embodiment.

A plurality of bidirectional switch semiconductor devices shown in FIG. 8B may be obtained by cutting off the connecting ribs along the dashed lines in FIG. 8A.

Figure 9A:
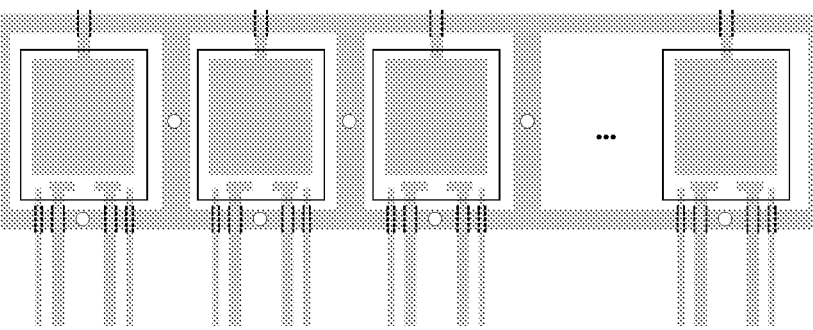
FIG. 9A is another schematic diagram of cropping of a lead frame according to an embodiment.

Optionally, in some feasible implementations, FIG. 9A is another schematic diagram of cropping of a lead frame according to an embodiment. As shown in FIG. 9A, a difference between a package structure (not shown in the figure) of the bidirectional switch and the package structure shown in FIG. 5 lies in that the fifth inner pin 535 is disposed at different positions. In this case, other inner pins (that is, the first inner pin 531, the second inner pin 532, the third inner pin 533, and the fourth inner pin 534) than the fifth inner pin 535 are disposed along the first side surface of the metal bottom plate, and the fifth inner pin 535 is disposed along a third side surface of the metal bottom plate. The first side surface is opposite to the third side surface.

Figure 9B:
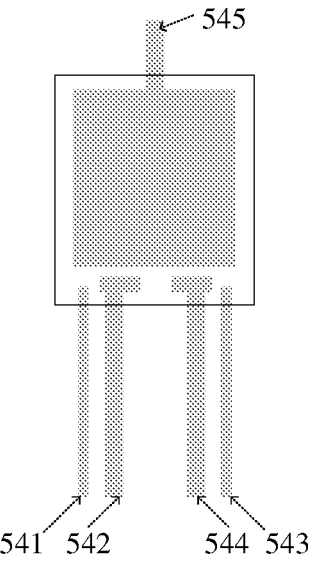
FIG. 9B is a schematic diagram of a bidirectional switch semiconductor device obtained after cropping is performed based on FIG. 9A according to an embodiment.

A plurality of bidirectional switch semiconductor devices shown in FIG. 9B may be obtained by cutting off the connecting ribs along the dashed lines in FIG. 9A. Optionally, in another possible implementation, a manner of cropping at the fifth outer pin may be cutting off in a horizontal direction (not shown in the figure), and only a connection between the outer pin and the frame body needs to be cut off.

Further, in some feasible implementations, a control terminal and a power terminal of a semiconductor switch in the bidirectional switch may be disposed separately. That is, the first inner pin 531 may be disposed on the second side surface or the third side surface of the metal bottom plate, the third inner pin 533 may also be disposed on the second side surface or the third side surface of the metal bottom plate, and the second inner pin 532 and the fourth inner pin 534 are disposed on the first side surface (not shown in the figure) of the metal bottom plate.

In some feasible implementations, pin widths of the first inner pin 531 and the third inner pin 533 are less than pin widths of the fifth inner pin 535, the second inner pin 532, and the fourth inner pin 534. Because the pin width is positively correlated with a magnitude of a current borne by the pin, a corresponding pin width may be set based on the magnitude of the current borne by each inner pin. In an implementation, the first inner pin 531 is coupled to the gate of the first semiconductor switch $Q_{S1}$, and the third inner pin 533 is coupled to the gate of the second semiconductor switch $Q_{S2}$. The gate is a control terminal, and a current flowing through the gate is relatively small. Therefore, the pin width may be relatively small. In addition, the fifth inner pin 535 is coupled to the drain of the first semiconductor switch $Q_{S1}$ and the drain of the second semiconductor switch $Q_{S2}$, the second inner pin 532 is coupled to the source of the first semiconductor switch $Q_{S1}$, and the fourth inner pin 534 is coupled to the source of the second semiconductor switch $Q_{S2}$. The drain and the source are used to connect a power circuit, and a current flowing through the drain and the source is relatively large. Therefore, the pin width is relatively large.

The bidirectional switch semiconductor device described above with reference to FIG. 5 to FIG. 9B has at least five outer pins. Optionally, in some feasible implementations, the bidirectional switch semiconductor device provided in this embodiment may have at least four outer pins and a cutting surface of one pin. An implementation may cut off a part of the fifth inner pin that exceeds the package housing in a cropping process.

Figure 10:
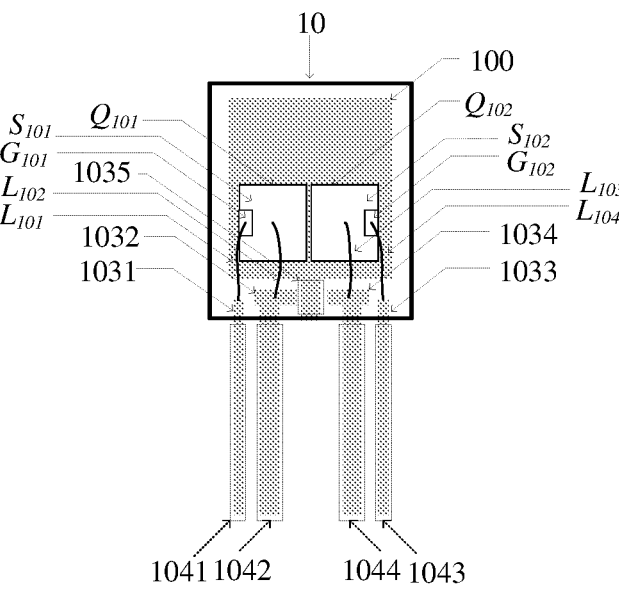
FIG. 10 is a schematic diagram of another package structure of a bidirectional switch according to an embodiment.

FIG. 10 is a schematic diagram of another package structure of a bidirectional switch according to an embodiment. As shown in FIG. 10, the package structure of the bidirectional switch includes a metal bottom plate 100, a first semiconductor switch $Q_{101}$, a second semiconductor switch $Q_{102}$, and a plurality of inner pins (for example, a first inner pin 1031, a second inner pin 1032, a third inner pin 1033, a fourth inner pin 1034, and a fifth inner pin 1035).

The metal bottom plate 100 may be implemented as a copper alloy, for example, an alloy such as copper-iron-phosphorus, copper-nickel-silicon, copper-chromium-zirconium, copper-silver, or copper-tin.

Wafers of the semiconductor switches are disposed on the metal bottom plate 100. That is, the first semiconductor switch $Q_{101}$ and the second semiconductor switch $Q_{102}$ are disposed on the metal bottom plate 100. In an implementation, the first terminal (that is, a drain) of the first semiconductor switch $Q_{101}$ and the first terminal (that is, a drain) of the second semiconductor switch $Q_{102}$ are disposed on the metal bottom plate 100. Because the metal bottom plate is conductive, the drain of the first semiconductor switch $Q_{101}$ may be coupled to the drain of the second semiconductor switch $Q_{102}$ by using the metal bottom plate 100.

The second terminal $G_{101}$ (that is, a gate) of the first semiconductor switch $Q_{101}$ is coupled to the first inner pin 1031 by using a thin metal wire $L_{101}$; and the third terminal $S_{101}$ (that is, a source) of the first semiconductor switch $Q_{101}$ is coupled to the second inner pin 1032 by using a thin metal wire $L_{102}$. The second terminal $G_{102}$ (that is, a gate) of the second semiconductor switch $Q_{102}$ is coupled to the third inner pin 1033 by using a thin metal wire $L_{104}$; and the third terminal $S_{102}$ (that is, a source) of the second semiconductor switch $Q_{102}$ is coupled to the fourth inner pin 1034 by using a thin metal wire $L_{103}$. In addition, the metal bottom plate 100 is coupled to the fifth inner pin 1035.

For example, the thin metal wire in this embodiment may be implemented as a gold wire, a silver wire, a copper wire, or an aluminum wire.

The package structure of the bidirectional switch further includes a first outer pin 1041 coupled to the first inner pin 1031, a second outer pin 1042 coupled to the second inner pin 1032, a third outer pin 1043 coupled to the third inner pin 1033, and a fourth outer pin 1044 coupled to the fourth inner pin 1034. A package housing 10 is formed by plastically packaging the metal bottom plate 100 and all of the plurality of inner pins by using a plastic package material (for example, plastic package is performed by using epoxy resin). In this case, the first inner pin 1031, the second inner pin 1032, the third inner pin 1033, the fourth inner pin 1034, and the fifth inner pin 1035 are all covered by the package housing 10, the first outer pin 1041, the second outer pin 1042, the third outer pin 1043, and the fourth outer pin 1044 are exposed outside the package housing 10, and a cutting surface formed after a part that is of the fifth inner pin 1035 and that exceeds the package housing 10 is cut is also exposed outside the package housing 10.

Therefore, in a product form, the bidirectional switch semiconductor device provided in this embodiment has at least four outer pins and a cutting surface of a pin.

Compared with the package structure of the bidirectional switch shown in FIG. 5, the package structure of the bidirectional switch shown in FIG. 10 does not have the fifth outer pin, and a cutting surface of a pin exposed outside the package housing is added to a position of the fifth outer pin in FIG. 5. It may be understood that, a position of coupling between the two semiconductor switches of the bidirectional switch may not need to be connected to another electronic element. Therefore, the coupling pin (that is, the fifth outer pin) may be cut off in a cropping process, so that the beneficial effects described above with reference to FIG. 5 can also be achieved, that is, the stray inductance of the current loop of the bidirectional switch is reduced.

In addition, because the fifth outer pin is cut off, when the bidirectional switch semiconductor device provided in this embodiment is used, the fifth outer pin may not need to be welded on a PCB board, and during PCB wiring, safety avoidance between the fifth outer pin and the second outer pin or between the fifth outer pin and the fourth outer pin does not need to be considered, to facilitate PCB wiring.

For a lead frame on which the bidirectional switch semiconductor device is carried, still refer to FIG. 6. A point of cropping is different. In this embodiment, each inner pin is still coupled to the connecting rib 62 by using a corresponding outer pin, so that the metal bottom plate and all the inner pins can still form a part of the same lead frame.

Figure 11A:
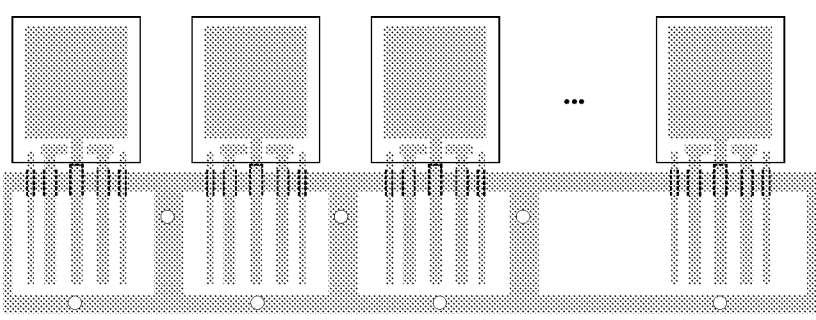
FIG. 11A is another schematic diagram of cropping of a lead frame according to an embodiment.

In a package process of the lead frame, the lead frame is plastically packaged, and after the epoxy resin is solidified, the connecting ribs between the outer pins and the fifth outer pin are cut off. In this case, refer to FIG. 11A. FIG. 11A is another schematic diagram of cropping of a lead frame according to an embodiment. As shown in FIG. 11A, the connecting ribs are cut off along the dashed lines in FIG. 11A. Different from the schematic diagram of cropping in FIG. 7A, in FIG. 11A, cutting in a horizontal direction is added at the fifth outer pin to cut off a part (that is, the fifth outer pin) that is of the fifth inner pin and that exceeds the package housing, so as to obtain a plurality of bidirectional switch semiconductor devices shown in FIG. 11B.

Figure 11B:
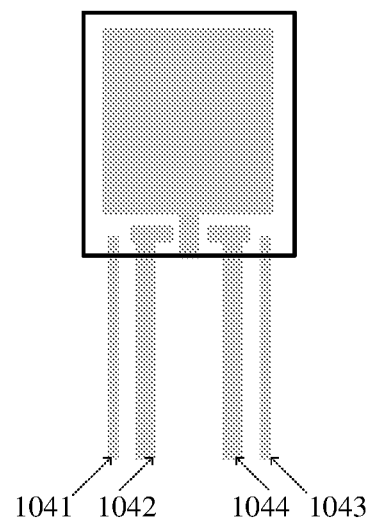
FIG. 11B is a schematic diagram of a bidirectional switch semiconductor device obtained after cropping is performed based on FIG. 11A according to an embodiment.

It may be understood that, the semiconductor device shown in FIG. 11B is viewed by using a method such as an X-ray, and the wafers and the thin metal wires shown in FIG. 10 may be seen.

It can be understood that, in this embodiment, a package process of the lead frame is used, and the metal bottom plate and all pins (each pin includes an inner pin and an outer pin) are still a part of the same lead frame, but a procedure of cutting off the fifth outer pin is added in the cropping process.

Similarly, FIG. 11A and FIG. 11B should be understood as examples of positions at which the inner pins are disposed in the package structure of the bidirectional switch and should not be construed as a limitation.

For example, in FIG. 11A and FIG. 11B, each inner pin is disposed along a first side surface of the metal bottom plate, that is, all the inner pins are located on a same side of the metal bottom plate. For another example, the fifth inner pin 1035 may be located at a different side of the metal bottom plate from the first inner pin 1031, the second inner pin 1032, the third inner pin 1033, and the fourth inner pin 1034.

Figure 12A:
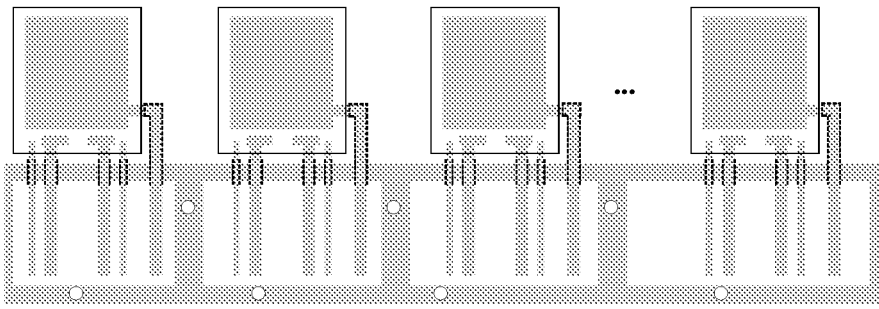
FIG. 12A is another schematic diagram of cropping of a lead frame according to an embodiment.

Optionally, in some feasible implementations, FIG. 12A is another schematic diagram of cropping of a lead frame according to an embodiment. As shown in FIG. 12A, a difference between a package structure (not shown in the figure) of the bidirectional switch and the package structure shown in FIG. 10 lies in that the fifth inner pin 1035 is disposed at different positions. In this case, other inner pins (that is, the first inner pin 1031, the second inner pin 1032, the third inner pin 1033, and the fourth inner pin 1034) than the fifth inner pin 1035 are disposed along the first side surface of the metal bottom plate, and the fifth inner pin 1035 is disposed along the second side surface of the metal bottom plate. The first side surface is adjacent to the second side surface.

It should be noted that, FIG. 12A shows that the second side surface is on the left of the first side surface. Actually, the second side surface may be on the right of the first side surface (not shown in the figure).

Figure 12B:
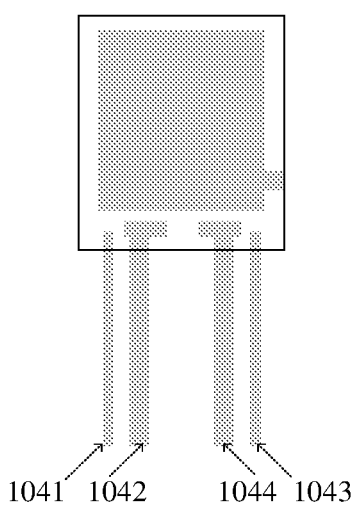
FIG. 12B is a schematic diagram of a bidirectional switch semiconductor device obtained after cropping is performed based on FIG. 12A according to an embodiment.

The connecting ribs are cut off along the dashed lines in FIG. 12A. Different from the schematic diagram of cropping in FIG. 8A, in FIG. 12A, cutting in a vertical direction is added at the fifth outer pin to cut off a part (that is, the fifth outer pin) that is of the fifth inner pin 1035 and that exceeds the package housing, so as to obtain a plurality of bidirectional switch semiconductor devices shown in FIG. 12B.

Figure 13A:
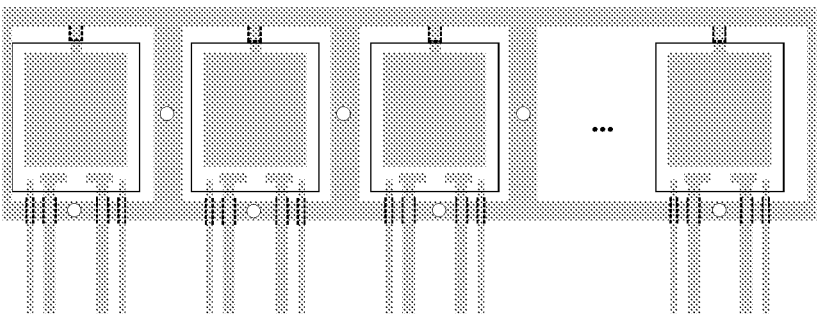
FIG. 13A is another schematic diagram of cropping of a lead frame according to an embodiment.

Optionally, in some feasible implementations, FIG. 13A is another schematic diagram of cropping of a lead frame according to an embodiment. As shown in FIG. 13A, a difference between a package structure (not shown in the figure) of the bidirectional switch and the package structure shown in FIG. 10 lies in that the fifth inner pin 1035 is disposed at different positions. In this case, other inner pins (that is, the first inner pin 1031, the second inner pin 1032, the third inner pin 1033, and the fourth inner pin 1034) than the fifth inner pin 1035 are disposed along the first side surface of the metal bottom plate, and the fifth inner pin 1035 is disposed along a third side surface of the metal bottom plate. The first side surface is opposite to the third side surface.

Figure 13B:
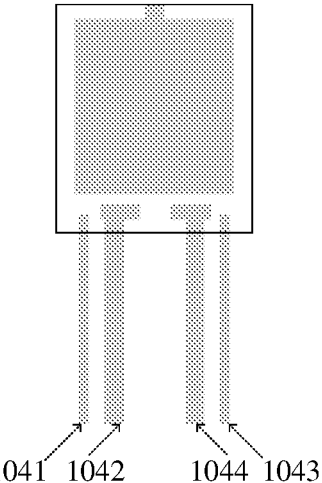
FIG. 13B is a schematic diagram of a bidirectional switch semiconductor device obtained after cropping is performed based on FIG. 13A according to an embodiment.

The connecting ribs are cut off along the dashed lines in FIG. 13A. Different from the schematic diagram of cropping in FIG. 9A, in FIG. 13A, cutting in a horizontal direction is added at the fifth outer pin to cut off a part (that is, the fifth outer pin) that is of the fifth inner pin 1035 and that exceeds the package housing, so as to obtain a plurality of bidirectional switch semiconductor devices shown in FIG. 13B.

The foregoing describes, with reference to FIG. 5 to FIG. 13B, an embodiment in which a semiconductor switch may be implemented as an MOSFET. The following describes how a semiconductor switch may be implemented as an IGBT.

Figure 14:
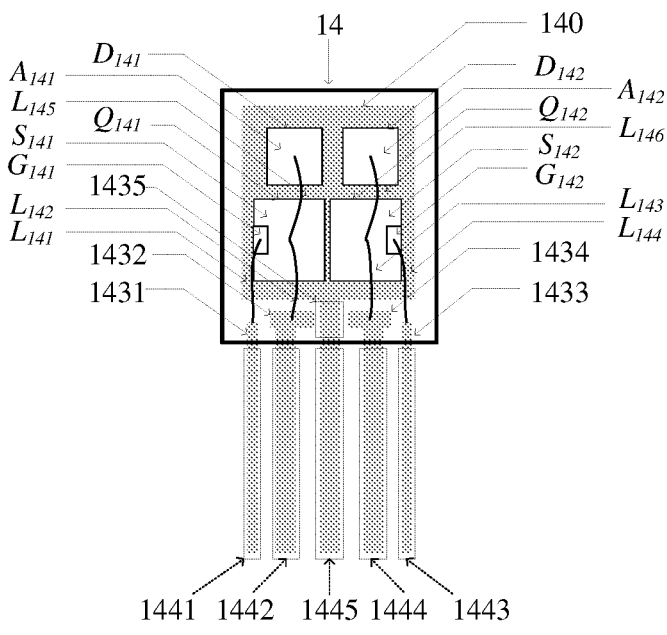
FIG. 14 is a schematic diagram of another package structure of a bidirectional switch according to an embodiment.

In some feasible implementations, FIG. 14 is a schematic diagram of another package structure of a bidirectional switch according to an embodiment. As shown in FIG. 14, the package structure of the bidirectional switch includes a metal bottom plate 140, a first semiconductor switch $Q_{141}$, a first diode $D_{141}$, a second semiconductor switch $Q_{142}$, a second diode $D_{142}$, and a plurality of inner pins (for example, a first inner pin 1431, a second inner pin 1432, a third inner pin 1433, a fourth inner pin 1434, and a fifth inner pin 1435).

The metal bottom plate 140 may be implemented as a copper alloy, for example, an alloy such as copper-iron-phosphorus, copper-nickel-silicon, copper-chromium-zirconium, copper-silver, or copper-tin.

Compared with the foregoing package structure of the bidirectional switch shown with reference to FIG. 5, the package structure of the bidirectional switch provided in this embodiment has wafers of the diodes.

In this case, the wafers of the diodes and the wafers of the semiconductor switches are all disposed on the metal bottom plate 140, that is, the first semiconductor switch $Q_{141}$, the first diode $D_{141}$, the second semiconductor switch $Q_{142}$, and the second diode $D_{142}$ are all disposed on the metal bottom plate 140. In an implementation, a first terminal (that is, a collector) of the first semiconductor switch $Q_{141}$ and a first terminal (that is, a collector) of the second semiconductor switch $Q_{142}$ are disposed on the metal bottom plate 140, and a cathode of the first diode $D_{141}$ and a cathode of the second diode $D_{142}$ are disposed on the metal bottom plate 140. Because the metal bottom plate is conductive, the collector of the first semiconductor switch $Q_{141}$, the collector of the second semiconductor switch $Q_{142}$, the cathode of the first diode $D_{141}$, and the cathode of the second diode $D_{142}$ may be coupled by using the metal bottom plate 140.

It should be noted that, the semiconductor switch in the package structure of the bidirectional switch may be implemented as an IGBT, and the semiconductor device having the package structure shown in FIG. 14 is the semiconductor device 32 in FIG. 3B and the semiconductor device 42 in FIG. 4B.

A second terminal $G_{141}$ (that is, a gate) of the first semiconductor switch $Q_{141}$ is coupled to the first inner pin 1431 by using a thin metal wire $L_{141}$; and a third terminal $S_{141}$ (that is, an emitter) of the first semiconductor switch $Q_{141}$ is coupled to the second inner pin 1432 by using a thin metal wire $L_{142}$. A second terminal $G_{142}$ (that is, a gate) of the second semiconductor switch $Q_{142}$ is coupled to the third inner pin 1433 by using a thin metal wire $L_{144}$; and a third terminal $S_{142}$ (that is, an emitter) of the second semiconductor switch $Q_{142}$ is coupled to the fourth inner pin 1434 by using a thin metal wire $L_{143}$. In addition, the metal bottom plate 140 is coupled to the fifth inner pin 1435. In this case, an anode $A_{141}$ of the first diode $D_{141}$ is coupled to the emitter of the first semiconductor switch $Q_{141}$ by using a thin metal wire $L_{145}$, that is, the anode $A_{141}$ of the first diode $D_{141}$ is coupled to the second inner pin 1432; and an anode $A_{142}$ of the second diode $D_{142}$ is coupled to the emitter of the second semiconductor switch $Q_{142}$ by using a thin metal wire $L_{146}$, that is, the anode $A_{142}$ of the second diode $D_{142}$ is coupled to the fourth inner pin 1434.

For example, the thin metal wire in this embodiment may be implemented as a gold wire, a silver wire, a copper wire, or an aluminum wire.

The package structure of the bidirectional switch further includes outer pins that are in a one-to-one correspondence with the inner pins, and any inner pin is coupled to an outer pin corresponding to the any inner pin. For example, the first inner pin 1431 is coupled to a first outer pin 1441, the second inner pin 1432 is coupled to a second outer pin 1442, the third inner pin 1433 is coupled to a third outer pin 1443, the fourth inner pin 1434 is coupled to a fourth outer pin 1444, and the fifth inner pin 1435 is coupled to a fifth outer pin 1445.

The bidirectional switch in this embodiment may be implemented as an integrated semiconductor device. In this case, a current may pass through the second outer pin 1442, the second inner pin 1432, the thin metal wire $L_{142}$, the fourth outer pin 1444, the fourth inner pin 1434, and the thin metal wire $L_{143}$. The second outer pin 1442 and the second inner pin 1432 are integrally formed into one pin, and the fourth outer pin 1444 and the fourth inner pin 1434 are integrally formed into one pin.

In other words, in this embodiment, stray inductance of a current loop of the bidirectional switch may also include inductance brought by two pins (each pin includes an inner pin and an outer pin) and two sections of thin metal wires. The beneficial effects of the package structure of the bidirectional switch shown in FIG. 5 can be achieved. That is, compared with the conventional technology, inductance brought by two pins (each pin includes an inner pin and an outer pin) and one section of PCB wiring is deducted from the stray inductance of the current loop. That is, the package structure of the bidirectional switch provided in this embodiment can also reduce the stray inductance of the current loop of the bidirectional switch.

In some feasible implementations, a package housing 14 is formed by plastically packaging the metal bottom plate 140 and all of the plurality of inner pins by using a plastic package material (for example, plastic package is performed by using epoxy resin). In this case, all the inner pins (that is, the first inner pin 1431, the second inner pin 1432, the third inner pin 1433, the fourth inner pin 1434, and the fifth inner pin 1435) are covered by the package housing 14, and the outer pins (that is, the first outer pin 1441, the second outer pin 1442, the third outer pin 1443, the fourth outer pin 1444, and the fifth outer pin 1445) in a one-to-one correspondence with the inner pins are all exposed outside the package housing 14.

It may be understood that, in a product form, the bidirectional switch semiconductor device that has the package structure in this embodiment is the same as the bidirectional switch semiconductor device that has the package structure of FIG. 5, and both have at least five outer pins.

For a lead frame on which the bidirectional switch semiconductor device is carried, still refer to the foregoing description with reference to FIG. 6. Details are not described herein.

In a package process of the lead frame, the lead frame is plastically packaged, and after the epoxy resin is solidified, the connecting ribs between the outer pins are cut off. In this case, still refer to FIG. 7A. FIG. 7A is a schematic diagram of cropping of a lead frame according to an embodiment. As shown in FIG. 7A, a plurality of bidirectional switch semiconductor devices shown in FIG. 7B may be obtained by cutting off the connecting ribs along the dashed lines in FIG. 7A.

It may be understood that, in this embodiment, the semiconductor switch may be implemented as an IGBT. Because FIG. 7A is a schematic diagram obtained after plastic package, a semiconductor device obtained by implementing the semiconductor switch as an IGBT and a semiconductor device obtained by implementing the semiconductor switch as an MOSFET to look the same to the naked eye. The semiconductor device may be viewed by using a method such as an X-ray. If the package structure shown in FIG. 5 may be seen, the semiconductor device may be an MOSFET. If the package structure shown in FIG. 14 may be seen, the semiconductor device may be an IGBT.

Similarly, in some feasible implementations, for a cropping manner of the lead frame provided in this embodiment, further refer to the foregoing embodiments described with reference to FIG. 8A to FIG. 9B. Details are not described herein again.

Further, in some feasible implementations, a control terminal and a power terminal of a semiconductor switch in the bidirectional switch may be disposed separately. That is, the first inner pin 1431 may be disposed on the second side surface or the third side surface of the metal bottom plate, the third inner pin 1433 may also be disposed on the second side surface or the third side surface of the metal bottom plate, and the second inner pin 1432 and the fourth inner pin 1434 are disposed on the first side surface (not shown in the figure) of the metal bottom plate.

In some feasible implementations, pin widths of the first inner pin 1431 and the third inner pin 1433 are less than pin widths of the fifth inner pin 1435, the second inner pin 1432, and the fourth inner pin 1434. Because the pin width is positively correlated with a magnitude of a current borne by the pin, a corresponding pin width may be set based on the magnitude of the current borne by each inner pin. In an implementation, the first inner pin 1431 is coupled to the gate of the first semiconductor switch $Q_{141}$, and the third inner pin 1433 is coupled to the gate of the second semiconductor switch $Q_{142}$. The gate is a control terminal, and a current flowing through the gate is relatively small. Therefore, the pin width may be relatively small. In addition, the fifth inner pin 1435 is coupled to the drain of the first semiconductor switch $Q_{141}$ and the drain of the second semiconductor switch $Q_{142}$, the second inner pin 1432 is coupled to the source of the first semiconductor switch $Q_{141}$, and the fourth inner pin 1434 is coupled to the source of the second semiconductor switch $Q_{142}$. The drain and the source are used to connect a power circuit, and a current flowing through the drain and the source is relatively large. Therefore, the pin width is relatively large.

Optionally, in some feasible implementations, a part (that is, the fifth outer pin) that is of the fifth inner pin and that exceeds the package housing may be cut off.

Figure 15:
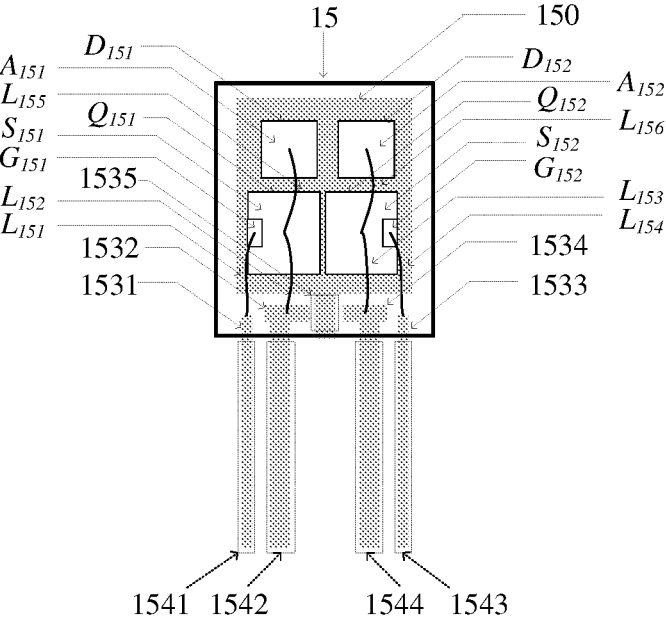
FIG. 15 is a schematic diagram of another package structure of a bidirectional switch according to an embodiment.

FIG. 15 is a schematic diagram of another package structure of a bidirectional switch according to an embodiment. As shown in FIG. 15, the package structure of the bidirectional switch includes a metal bottom plate 150, a first semiconductor switch $Q_{151}$, a first diode $D_{151}$, a second semiconductor switch $Q_{152}$, a second diode $D_{152}$, and a plurality of inner pins (for example, a first inner pin 1531, a second inner pin 1532, a third inner pin 1533, a fourth inner pin 1534, and a fifth inner pin 1535).

The metal bottom plate 150 may be implemented as a copper alloy, for example, an alloy such as copper-iron-phosphorus, copper-nickel-silicon, copper-chromium-zirconium, copper-silver, or copper-tin.

Compared with the foregoing package structure of the bidirectional switch shown with reference to FIG. 10, the package structure of the bidirectional switch provided in this embodiment may have wafers of the diodes.

In this case, the wafers of the diodes and the wafers of the semiconductor switches are all disposed on the metal bottom plate 150, that is, the first semiconductor switch $Q_{151}$, the first diode $D_{151}$, the second semiconductor switch $Q_{152}$, and the second diode $D_{152}$ are all disposed on the metal bottom plate 150. In an implementation, a first terminal (that is, a collector) of the first semiconductor switch $Q_{151}$ and a first terminal (that is, a collector) of the second semiconductor switch $Q_{152}$ are disposed on the metal bottom plate 150, and a cathode of the first diode $D_{151}$ and a cathode of the second diode $D_{152}$ are disposed on the metal bottom plate 150. Because the metal bottom plate is conductive, the collector of the first semiconductor switch $Q_{151}$, the collector of the second semiconductor switch $Q_{152}$, the cathode of the first diode $D_{151}$, and the cathode of the second diode $D_{152}$ may be coupled by using the metal bottom plate 150.

A second terminal $G_{151}$ (that is, a gate) of the first semiconductor switch $Q_{151}$ is coupled to the first inner pin 1531 by using a thin metal wire $L_{151}$; and a third terminal $S_{151}$ (that is, an emitter) of the first semiconductor switch $Q_{151}$ is coupled to the second inner pin 1532 by using a thin metal wire $L_{152}$. A second terminal $G_{152}$ (that is, a gate) of the second semiconductor switch $Q_{152}$ is coupled to the third inner pin 1533 by using a thin metal wire $L_{154}$; and a third terminal $S_{152}$ (that is, an emitter) of the second semiconductor switch $Q_{152}$ is coupled to the fourth inner pin 1534 by using a thin metal wire $L_{153}$. In addition, the metal bottom plate 150 is coupled to the fifth inner pin 1535. In this case, an anode $A_{151}$ of the first diode $D_{151}$ is coupled to the emitter of the first semiconductor switch $Q_{151}$ by using a thin metal wire $L_{155}$, that is, the anode $A_{151}$ of the first diode $D_{151}$ is coupled to the second inner pin 1532; and an anode $A_{152}$ of the second diode $D_{152}$ is coupled to the emitter of the second semiconductor switch $Q_{152}$ by using a thin metal wire $L_{156}$, that is, the anode $A_{152}$ of the second diode $D_{152}$ is coupled to the fourth inner pin 1534.

For example, the thin metal wire in this embodiment may be implemented as a gold wire, a silver wire, a copper wire, or an aluminum wire.

The package structure of the bidirectional switch further includes a first outer pin 1541 coupled to the first inner pin 1531, a second outer pin 1542 coupled to the second inner pin 1532, a third outer pin 1543 coupled to the third inner pin 1533, and a fourth outer pin 1544 coupled to the fourth inner pin 1534. A package housing 15 is formed by plastically packaging the metal bottom plate 150 and all of the plurality of inner pins by using a plastic package material (for example, plastic package is performed by using epoxy resin). In this case, the first inner pin 1531, the second inner pin 1532, the third inner pin 1533, the fourth inner pin 1534, and the fifth inner pin 1535 are all covered by the package housing 15, the first outer pin 1541, the second outer pin 1542, the third outer pin 1543, and the fourth outer pin 1544 are exposed outside the package housing 15, and a cutting surface formed after a part that is of the fifth inner pin 1535 and that exceeds the package housing 15 is cut is also exposed outside the package housing 15.

Therefore, in a product form, the bidirectional switch semiconductor device provided in this embodiment may have at least four outer pins and a cutting surface of a pin and the product form may be the same as the product form of the bidirectional switch semiconductor device shown in FIG. 10.

Compared with the package structure of the bidirectional switch shown in FIG. 14, the package structure of the bidirectional switch shown in FIG. 15 does not have the fifth outer pin, and a cutting surface of a pin exposed outside the package housing is added to a position of the fifth outer pin in FIG. 5, so that the beneficial effects described above with reference to FIG. 14 can also be achieved. In addition, the beneficial effects of the package structure of the bidirectional switch shown in FIG. 10 can be achieved. That is, during PCB wiring, safety avoidance between the fifth outer pin and the second outer pin or between the fifth outer pin and the fourth outer pin does not need to be considered, to facilitate PCB wiring.

For a lead frame on which the bidirectional switch semiconductor device is carried, still refer to the foregoing description with reference to FIG. 6. Details are not described herein.

In a package process of the lead frame, the lead frame is plastically packaged, and after the epoxy resin is solidified, the connecting ribs between the outer pins and the fifth outer pin are cut off. In this case, still refer to FIG. 11A. FIG. 11A is another schematic diagram of cropping of a lead frame according to an embodiment. As shown in FIG. 11A, a plurality of bidirectional switch semiconductor devices shown in FIG. 11B may be obtained by cutting off, along the dashed lines in FIG. 11A, the connecting ribs and a part (that is, the fifth outer pin) that is of the fifth inner pin and that exceeds the package housing.

Similarly, the semiconductor device is viewed by using a method such as an X-ray. If the package structure shown in FIG. 10 may be seen, the semiconductor device may be an MOSFET. If the package structure shown in FIG. 15 may be seen, the semiconductor device may be an IGBT.

In some feasible implementations, for a cropping manner of the lead frame provided in this embodiment, further refer to the foregoing embodiments described with reference to FIG. 12A to FIG. 13B. Details are not described herein again.

Further, in some feasible implementations, a control terminal and a power terminal of a semiconductor switch in the bidirectional switch may be disposed separately. That is, the first inner pin 1531 may be disposed on the second side surface or the third side surface of the metal bottom plate, the third inner pin 1533 may also be disposed on the second side surface or the third side surface of the metal bottom plate, and the second inner pin 1532 and the fourth inner pin 1534 are disposed on the first side surface (not shown in the figure) of the metal bottom plate.

In some feasible implementations, pin widths of the first inner pin 1531 and the third inner pin 1533 are less than pin widths of the fifth inner pin 1535, the second inner pin 1532, and the fourth inner pin 1534. Because the pin width is positively correlated with a magnitude of a current borne by the pin, a corresponding pin width may be set based on the magnitude of the current borne by each inner pin. In an implementation, the first inner pin 1531 is coupled to the gate of the first semiconductor switch $Q_{151}$, and the third inner pin 1533 is coupled to the gate of the second semiconductor switch $Q_{152}$. The gate is a control terminal, and a current flowing through the gate is relatively small. Therefore, the pin width may be relatively small. In addition, the fifth inner pin 1535 is coupled to the drain of the first semiconductor switch $Q_{151}$ and the drain of the second semiconductor switch $Q_{152}$, the second inner pin 1532 is coupled to the source of the first semiconductor switch $Q_{151}$, and the fourth inner pin 1534 is coupled to the source of the second semiconductor switch $Q_{152}$. The drain and the source are used to connect a power circuit, and a current flowing through the drain and the source is relatively large. Therefore, the pin width is relatively large.

Figure 16:
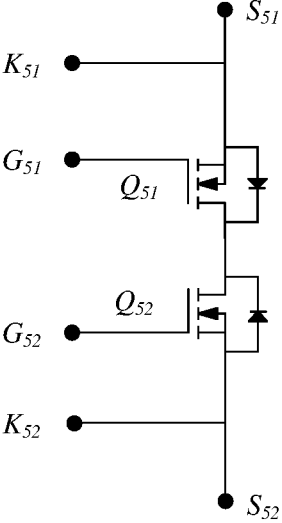
FIG. 16 is a schematic diagram of another circuit of a bidirectional switch.

Optionally, in some feasible implementations, FIG. 16 is a schematic diagram of another circuit of a bidirectional switch. As shown in FIG. 16, the bidirectional switch includes a first semiconductor switch $Q_{51}$ and a second semiconductor switch $Q_{52}$. The first semiconductor switch $Q_{51}$ includes a first terminal (that is, a drain), a second terminal $G_{51}$ (that is, a gate), and a third terminal $S_{51}$ (that is, a source) and $K_{51}$. It may be understood that, $S_{51}$ and $K_{51}$ are at a same potential. One pin is added to the first semiconductor switch $Q_{51}$ at the source for output, so that the control loop can be decoupled from the power loop. The control loop and the power loop of the first semiconductor switch $Q_{51}$ are relatively independent, so that a switching speed of the first semiconductor switch $Q_{51}$ can be improved. Similarly, the second semiconductor switch $Q_{52}$ includes a first terminal (that is, a drain), a second terminal $G_{52}$ (that is, a gate), and a third terminal $S_{52}$ (that is, a source) and $K_{52}$. It may be understood that, $S_{52}$ and $K_{52}$ are at a same potential. One pin is added to the second semiconductor switch $Q_{52}$ at the source for output, so that the control loop can be decoupled from the power loop. The control loop and the power loop of the second semiconductor switch $Q_{52}$ are relatively independent, so that a switching speed of the second semiconductor switch $Q_{52}$ can be improved.

Figure 17:
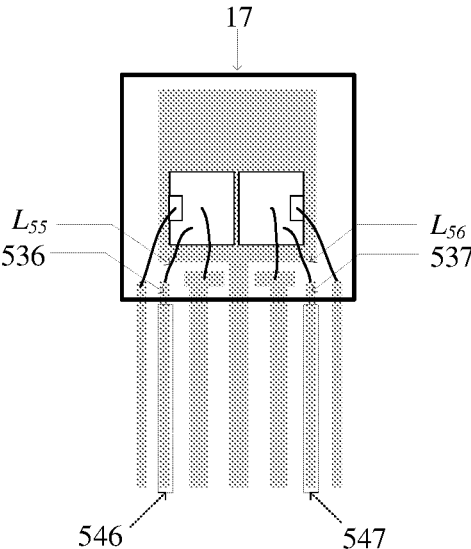
FIG. 17 is a schematic diagram of another package structure of a bidirectional switch according to an embodiment.

In this case, for a package structure of the bidirectional switch, refer to FIG. 17. FIG. 17 is a schematic diagram of another package structure of a bidirectional switch according to an embodiment. As shown in FIG. 17, based on the package structure shown in FIG. 5, the package structure of the bidirectional switch shown in FIG. 17 further includes a sixth inner pin 536, a seventh inner pin 537, a sixth outer pin 546 coupled to the sixth inner pin 536, and a seventh outer pin 547 coupled to the seventh inner pin 537.

A third terminal $S_{51}$ (that is, a source) of the first semiconductor switch $Q_{51}$ is coupled to the sixth inner pin 536 by using a thin metal wire $L_{55}$, and a third terminal $S_{52}$ (that is, a source) of the second semiconductor switch $Q_{52}$ is coupled to the seventh inner pin 537 by using a thin metal wire $L_{56}$.

In this embodiment, two pins (each pin includes an inner pin and an outer pin) are added to the package structure of the bidirectional switch, so that the bidirectional switch can implement a Kelvin connection method, and the control loop is decoupled from the power loop, so that the switching speed of the semiconductor switch is increased.

In some feasible implementations, a package housing 17 is formed by plastically packaging the metal bottom plate and all of the plurality of inner pins by using a plastic package material (for example, plastic package is performed by using epoxy resin). In this case, all the inner pins (that is, the first inner pin 531, the second inner pin 532, the third inner pin 533, the fourth inner pin 534, the fifth inner pin 535, the sixth inner pin 536, and the seventh inner pin 537) are covered by the package housing 17, and the outer pins (that is, the first outer pin 541, the second outer pin 542, the third outer pin 543, the fourth outer pin 544, the fifth outer pin 545, the sixth outer pin 546, and the seventh outer pin 547) in a one-to-one correspondence with the inner pins are all exposed outside the package housing 17.

Therefore, in a product form, the bidirectional switch semiconductor device provided in this embodiment may have at least seven outer pins. That is, compared with the semiconductor device having the package structure in FIG. 5, two outer pins are added to the semiconductor device having the package structure in FIG. 17.

Figure 18A:
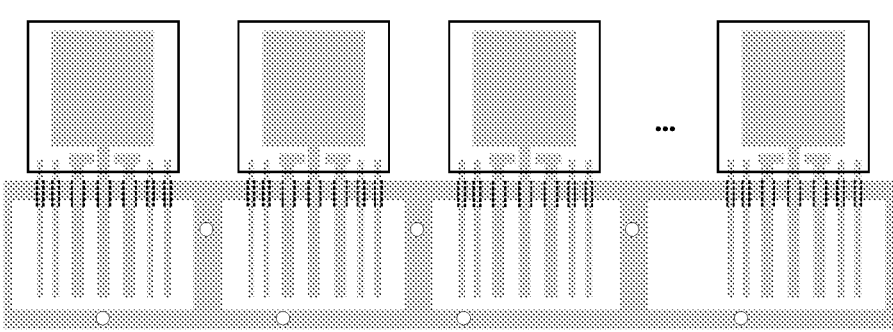
FIG. 18A is another schematic diagram of cropping of a lead frame according to an embodiment.
Figure 18B:
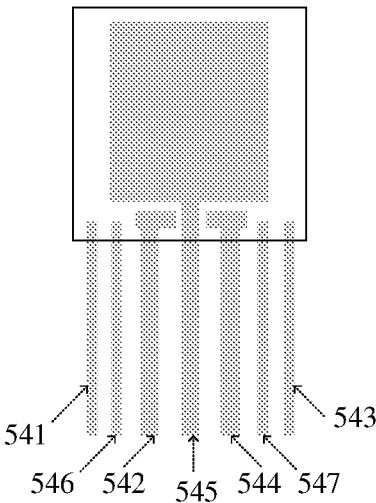
FIG. 18B is a schematic diagram of a bidirectional switch semiconductor device obtained after cropping is performed based on FIG. 18A according to an embodiment.

In a package process of the lead frame, the lead frame is plastically packaged, and after the epoxy resin is solidified, the connecting ribs between the outer pins are cut off. In this case, refer to FIG. 18A. FIG. 18A is another schematic diagram of cropping of a lead frame according to an embodiment. As shown in FIG. 18A, a plurality of bidirectional switch semiconductor devices shown in FIG. 18B may be obtained by cutting off the connecting ribs along the dashed lines in FIG. 18A.

Figure 19A:
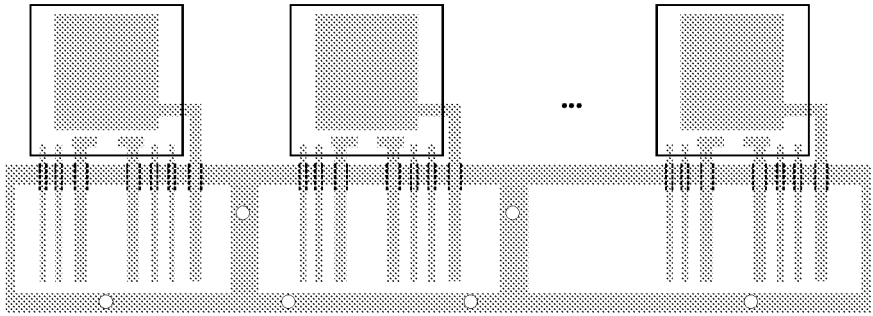
FIG. 19A is another schematic diagram of cropping of a lead frame according to an embodiment.

In some feasible implementations, FIG. 19A is another schematic diagram of cropping of a lead frame according to an embodiment. As shown in FIG. 19A, a difference between a package structure (not shown in the figure) of the bidirectional switch and the package structure shown in FIG. 17 lies in that the fifth inner pin 535 is disposed at different positions. In this case, other inner pins (that is, the first inner pin 531, the second inner pin 532, the third inner pin 533, and the fourth inner pin 534) than the fifth inner pin 535 are disposed along the first side surface of the metal bottom plate, and the fifth inner pin 535 is disposed along the second side surface of the metal bottom plate. The first side surface is adjacent to the second side surface.

It should be noted that, FIG. 19A shows that the second side surface is on the left of the first side surface. Actually, the second side surface may be on the right of the first side surface (not shown in the figure).

Figure 19B:
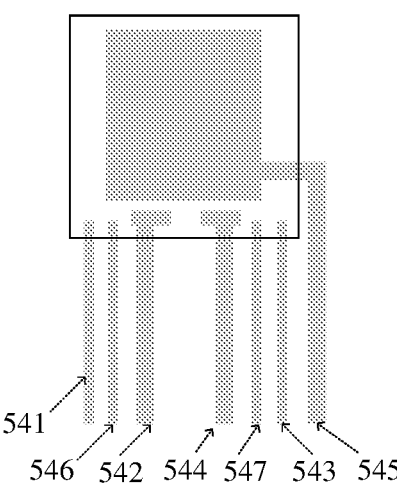
FIG. 19B is a schematic diagram of a bidirectional switch semiconductor device obtained after cropping is performed based on FIG. 19A according to an embodiment.

A plurality of bidirectional switch semiconductor devices shown in FIG. 19B may be obtained by cutting off the connecting ribs along the dashed lines in FIG. 19A.

Figure 20A:
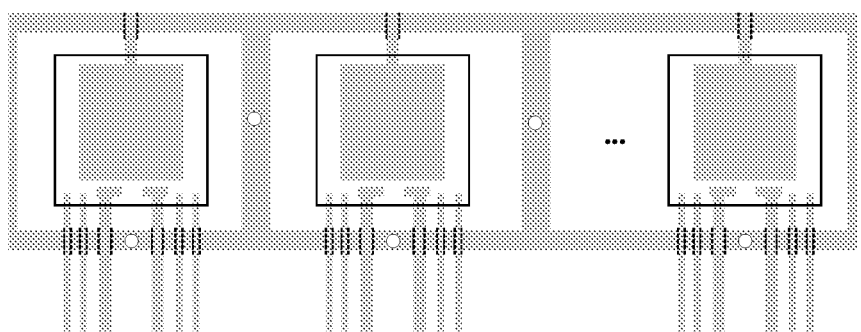
FIG. 20A is another schematic diagram of cropping of a lead frame according to an embodiment.

Optionally, in some feasible implementations, FIG. 20A is another schematic diagram of cropping of a lead frame according to an embodiment. As shown in FIG. 20A, a difference between a package structure (not shown in the figure) of the bidirectional switch and the package structure shown in FIG. 17 lies in that the fifth inner pin 535 is disposed at different positions. In this case, other inner pins (that is, the first inner pin 531, the second inner pin 532, the third inner pin 533, and the fourth inner pin 534) than the fifth inner pin 535 are disposed along the first side surface of the metal bottom plate, and the fifth inner pin 535 is disposed along a third side surface of the metal bottom plate. The first side surface is opposite to the third side surface.

Figure 20B:
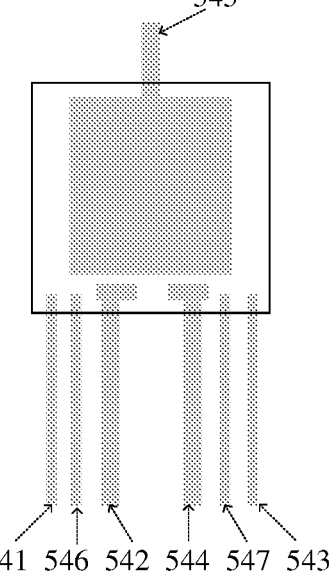
FIG. 20B is a schematic diagram of a bidirectional switch semiconductor device obtained after cropping is performed based on FIG. 20A according to an embodiment.

A plurality of bidirectional switch semiconductor devices shown in FIG. 20B may be obtained by cutting off the connecting ribs along the dashed lines in FIG. 20A. Optionally, in another possible implementation, a manner of cropping at the fifth outer pin may be cutting off in a horizontal direction (not shown in the figure), and only a connection between the outer pin and the frame body needs to be cut off.

Optionally, in some feasible implementations, a part (that is, the fifth outer pin) that is of the fifth inner pin and that exceeds the package housing may be cut off. In this case, in a product form, it can be seen that the bidirectional switch semiconductor device provided in this embodiment may have at least six outer pins and a cutting surface of a pin.

Figure 21:
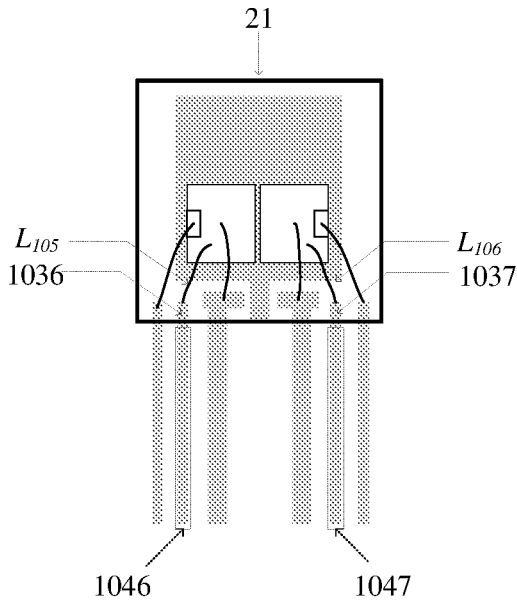
FIG. 21 is a schematic diagram of another package structure of a bidirectional switch according to an embodiment.

FIG. 21 is a schematic diagram of another package structure of a bidirectional switch according to an embodiment. As shown in FIG. 21, based on the package structure shown in FIG. 10, the package structure of the bidirectional switch shown in FIG. 21 further includes a sixth inner pin 1036, a seventh inner pin 1037, a sixth outer pin 1046 coupled to the sixth inner pin 1036, and a seventh outer pin 1047 coupled to the seventh inner pin 1037.

A third terminal $S_{101}$ (that is, a source) of the first semiconductor switch $Q_{101}$ is coupled to the sixth inner pin 1036 by using a thin metal wire $L_{105}$, and a third terminal $S_{102}$ (that is, a source) of the second semiconductor switch $Q_{102}$ is coupled to the seventh inner pin 1037 by using a thin metal wire $L_{106}$.

In some feasible implementations, a package housing 21 is formed by plastically packaging the metal bottom plate and all of the plurality of inner pins by using a plastic package material (for example, plastic package is performed by using epoxy resin). In this case, all the inner pins (that is, the first inner pin 1031, the second inner pin 1032, the third inner pin 1033, the fourth inner pin 1034, the fifth inner pin 1035, the sixth inner pin 1036, and the seventh inner pin 1037) are covered by the package housing 21, and the first outer pin 1041, the second outer pin 1042, the third outer pin 1043, the fourth outer pin 1044, the sixth outer pin 1046, and the seventh outer pin 1047 are all exposed outside the package housing 21. In this case, a cutting surface formed after the part that is of the fifth inner pin 1035 and that exceeds the package housing 21 is cut off is also exposed outside the package housing 21.

Therefore, in a product form, the bidirectional switch semiconductor device provided in this embodiment may have at least six outer pins and a cutting surface of a pin. That is, compared with the semiconductor device having the package structure in FIG. 10, two outer pins are added to the semiconductor device having the package structure in FIG. 21.

Figure 22A:
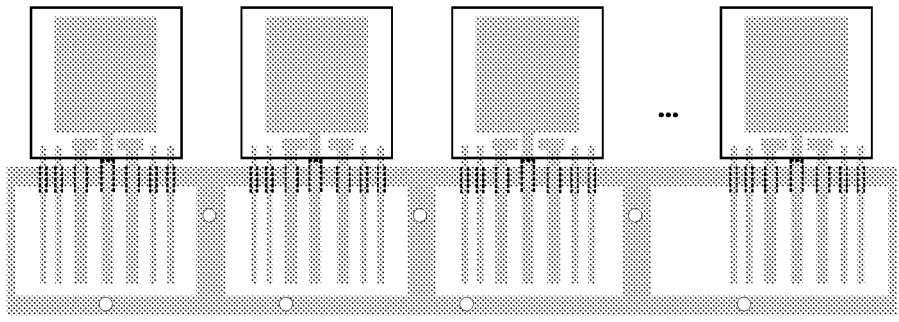
FIG. 22A is another schematic diagram of cropping of a lead frame according to an embodiment.
Figure 22B:
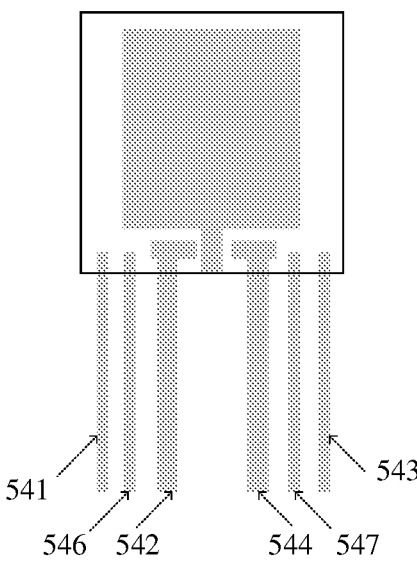
FIG. 22B is a schematic diagram of a bidirectional switch semiconductor device obtained after cropping is performed based on FIG. 22A according to an embodiment.

In a package process of the lead frame, the lead frame is plastically packaged, and after the epoxy resin is solidified, the connecting ribs between the outer pins are cut off. In this case, refer to FIG. 22A. FIG. 22A is another schematic diagram of cropping of a lead frame according to an embodiment. As shown in FIG. 22A, a plurality of bidirectional switch semiconductor devices shown in FIG. 22B may be obtained by cutting off the connecting ribs along the dashed lines in FIG. 22A.

Figure 23A:
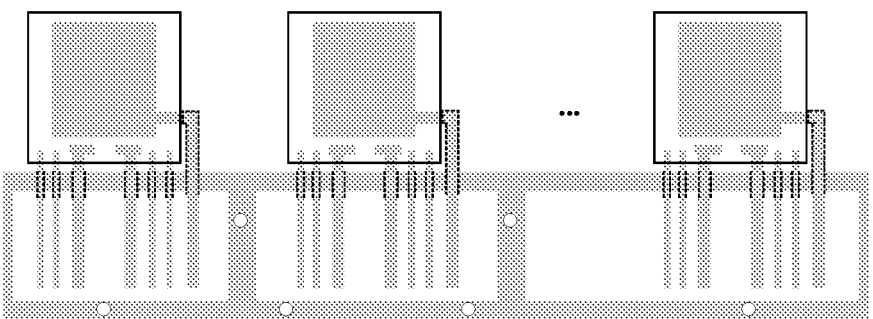
FIG. 23A is another schematic diagram of cropping of a lead frame according to an embodiment.

In some feasible implementations, FIG. 23A is another schematic diagram of cropping of a lead frame according to an embodiment. As shown in FIG. 23A, a difference between a package structure (not shown in the figure) of the bidirectional switch and the package structure shown in FIG. 21 lies in that the fifth inner pin 1035 is disposed at different positions. In this case, other inner pins (that is, the first inner pin 1031, the second inner pin 1032, the third inner pin 1033, and the fourth inner pin 1034) than the fifth inner pin 1035 are disposed along the first side surface of the metal bottom plate, and the fifth inner pin 1035 is disposed along the second side surface of the metal bottom plate. The first side surface is adjacent to the second side surface.

It should be noted that, FIG. 23A shows that the second side surface is on the left of the first side surface. Actually, the second side surface may be on the right of the first side surface (not shown in the figure).

Figure 23B:
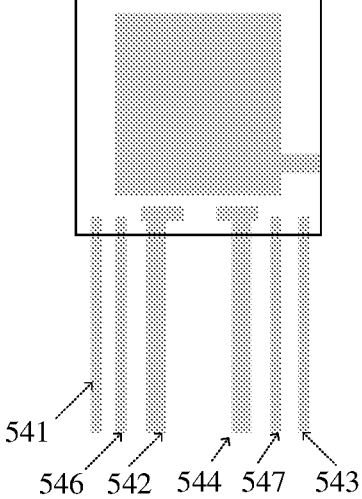
FIG. 23B is a schematic diagram of a bidirectional switch semiconductor device obtained after cropping is performed based on FIG. 23A according to an embodiment.

A plurality of bidirectional switch semiconductor devices shown in FIG. 23B may be obtained by cutting off the connecting ribs along the dashed lines in FIG. 23A.

Figure 24A:
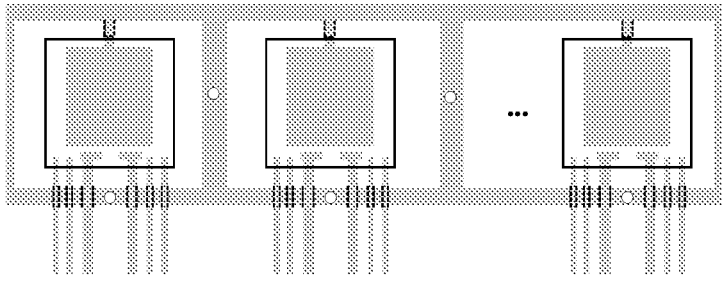
FIG. 24A is another schematic diagram of cropping of a lead frame according to an embodiment.

Optionally, in some feasible implementations, FIG. 24A is another schematic diagram of cropping of a lead frame according to an embodiment. As shown in FIG. 24A, a difference between a package structure (not shown in the figure) of the bidirectional switch and the package structure shown in FIG. 21 lies in that the fifth inner pin 1035 is disposed at different positions. In this case, other inner pins (that is, the first inner pin 1031, the second inner pin 1032, the third inner pin 1033, and the fourth inner pin 1034) than the fifth inner pin 1035 are disposed along the first side surface of the metal bottom plate, and the fifth inner pin 1035 is disposed along a third side surface of the metal bottom plate. The first side surface is opposite to the third side surface.

Figure 24B:
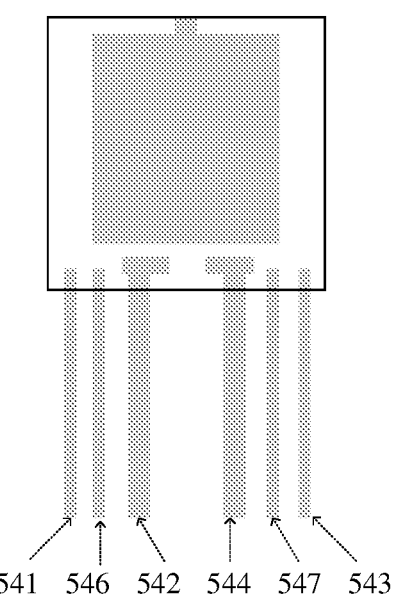
FIG. 24B is a schematic diagram of a bidirectional switch semiconductor device obtained after cropping is performed based on FIG. 24A according to an embodiment.

A plurality of bidirectional switch semiconductor devices shown in FIG. 24B may be obtained by cutting off the connecting ribs along the dashed lines in FIG. 24A.

The foregoing describes, with reference to FIG. 17 to FIG. 24B, an embodiment in which a semiconductor switch may be implemented as an MOSFET Kelvin connection method. The following describes how a semiconductor switch may be implemented as an IGBT Kelvin connection method.

Figure 25:
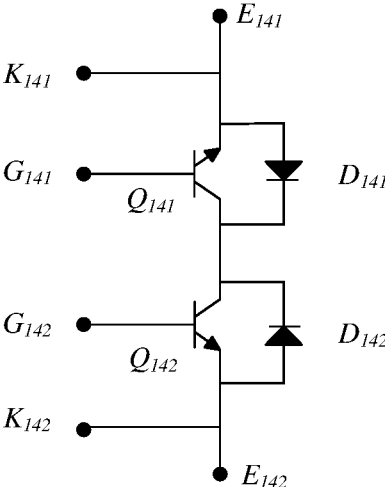
FIG. 25 is a schematic diagram of another circuit of a bidirectional switch.

FIG. 25 is a schematic diagram of another circuit of a bidirectional switch. As shown in FIG. 25, the bidirectional switch includes a first semiconductor switch $Q_{141}$, a first diode $D_{141}$, a second semiconductor switch $Q_{142}$, and a second diode $D_{142}$. The first semiconductor switch $Q_{141}$ includes a first terminal (that is, a collector), a second terminal $G_{141}$ (that is, a gate), and a third terminal $E_{141}$ (that is, an emitter) and $K_{141}$. It may be understood that, $S_{141}$ and $K_{141}$ are at a same potential. One pin is added to the first semiconductor switch $Q_{141}$ at the emitter for output, so that the control loop can be decoupled from the power loop. The control loop and the power loop of the first semiconductor switch $Q_{141}$ are relatively independent, so that a switching speed of the first semiconductor switch $Q_{141}$ can be improved. Similarly, the second semiconductor switch $Q_{142}$ includes a first terminal (that is, a collector), a second terminal $G_{142}$ (that is, a gate), and a third terminal $E_{142}$ (that is, an emitter) and $K_{142}$. It may be understood that, $S_{142}$ and $K_{142}$ are at a same potential. One pin is added to the second semiconductor switch $Q_{142}$ at the emitter for output, so that the control loop can be decoupled from the power loop. The control loop and the power loop of the second semiconductor switch $Q_{142}$ are relatively independent, so that a switching speed of the second semiconductor switch $Q_{142}$ can be improved.

Figure 26:
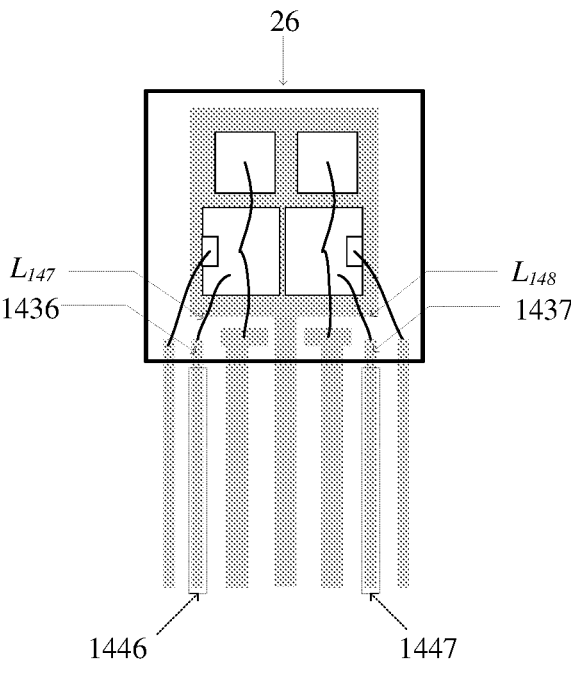
FIG. 26 is a schematic diagram of another package structure of a bidirectional switch according to an embodiment.

In this case, for a package structure of the bidirectional switch, refer to FIG. 26. FIG. 26 is a schematic diagram of another package structure of a bidirectional switch according to an embodiment. As shown in FIG. 26, based on the package structure shown in FIG. 14, the package structure of the bidirectional switch shown in FIG. 26 further includes a sixth inner pin 1436, a seventh inner pin 1437, a sixth outer pin 1446 coupled to the sixth inner pin 1436, and a seventh outer pin 1447 coupled to the seventh inner pin 1437.

A third terminal $S_{141}$ (that is, an emitter) of the first semiconductor switch $Q_{141}$ is coupled to the sixth inner pin 1436 by using a thin metal wire $L_{147}$, and a third terminal $S_{142}$ (that is, a collector) of the second semiconductor switch $Q_{142}$ is coupled to the seventh inner pin 1437 by using a thin metal wire $L_{148}$.

In this embodiment, two pins (each pin includes an inner pin and an outer pin) may be added to the package structure of the bidirectional switch so that the bidirectional switch can implement a Kelvin connection method and the control loop may be decoupled from the power loop so that the switching speed of the semiconductor switch is increased.

In some feasible implementations, a package housing 26 is formed by plastically packaging the metal bottom plate and all of the plurality of inner pins by using a plastic package material (for example, plastic package is performed by using epoxy resin). In this case, all the inner pins (that is, the first inner pin 1431, the second inner pin 1432, the third inner pin 1433, the fourth inner pin 1434, the fifth inner pin 1435, the sixth inner pin 1436, and the seventh inner pin 1437) are covered by the package housing 26, and the outer pins (that is, the first outer pin 1441, the second outer pin 1442, the third outer pin 1443, the fourth outer pin 1444, the fifth outer pin 1445, the sixth outer pin 1446, and the seventh outer pin 1447) in a one-to-one correspondence with the inner pins are all exposed outside the package housing 26.

Therefore, in a product form, the bidirectional switch semiconductor device provided in this embodiment may have at least seven outer pins. That is, compared with the semiconductor device having the package structure in FIG. 14, two outer pins are added to the semiconductor device having the package structure in FIG. 26.

In a package process of the lead frame, the lead frame is plastically packaged, and after the epoxy resin is solidified, the connecting ribs between the outer pins are cut off. In this case, still refer to FIG. 18A. FIG. 18A is another schematic diagram of cropping of a lead frame according to an embodiment. As shown in FIG. 18A, a plurality of bidirectional switch semiconductor devices shown in FIG. 18B may be obtained by cutting off the connecting ribs along the dashed lines in FIG. 18A.

In some feasible implementations, for a cropping manner of the lead frame provided in this embodiment, further refer to the foregoing embodiments described with reference to FIG. 19A to FIG. 20B. Details are not described herein again.

Optionally, in some feasible implementations, a part (that is, the fifth outer pin) that is of the fifth inner pin and that exceeds the package housing may be cut off. In this case, in a product form, it can be seen that the bidirectional switch semiconductor device provided in this embodiment may have at least six outer pins and a cutting surface of a pin.

Figure 27:
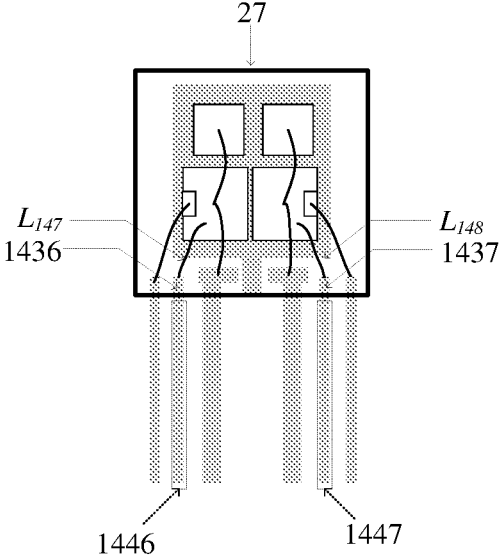
FIG. 27 is a schematic diagram of another package structure of a bidirectional switch according to an embodiment.

FIG. 27 is a schematic diagram of another package structure of a bidirectional switch according to an embodiment. As shown in FIG. 27, all the inner pins (that is, the first inner pin 1431, the second inner pin 1432, the third inner pin 1433, the fourth inner pin 1434, the fifth inner pin 1435, the sixth inner pin 1436, and the seventh inner pin 1437) are covered by the package housing 27, and the first outer pin 1441, the second outer pin 1442, the third outer pin 1443, the fourth outer pin 1444, the sixth outer pin 1446, and the seventh outer pin 1447 are all exposed outside the package housing 27. In this case, a cutting surface formed after the part that is of the fifth inner pin 1435 and that exceeds the package housing 21 is cut off is also exposed outside the package housing 27.

Therefore, in a product form, the bidirectional switch semiconductor device provided in this embodiment may have at least six outer pins and a cutting surface of a pin. That is, compared with the semiconductor device having the package structure shown in FIG. 15, two outer pins and a cutting surface of a pin are added to the semiconductor device having the package structure shown in FIG. 27.

In a package process of the lead frame, the lead frame is plastically packaged, and after the epoxy resin is solidified, the connecting ribs between the outer pins and the fifth outer pin are cut off. In this case, refer to FIG. 22A. FIG. 22A is another schematic diagram of cropping of a lead frame according to an embodiment. As shown in FIG. 22A, a plurality of bidirectional switch semiconductor devices shown in FIG. 22B may be obtained by cutting off the connecting ribs along the dashed lines in FIG. 22A.

In some feasible implementations, for a cropping manner of the lead frame provided in this embodiment, further refer to the foregoing embodiments described with reference to FIG. 23A to FIG. 24B. Details are not described herein again.

It should be noted that, the terms "first" and "second" are merely intended for a purpose of description, and cannot be understood as indicating or implying relative importance.

The foregoing descriptions are merely implementations but are not intended to limit the scope of the embodiments. Any variation or replacement readily figured out by a person skilled in the art shall fall within the scope of the embodiments.

The invention claimed is:

1. A package structure of a bidirectional switch, comprising:

a metal bottom plate;

a first semiconductor switch;

a second semiconductor switch, and a plurality of inner pins, wherein the plurality of inner pins comprises a first inner pin, a second inner pin, a third inner pin, a fourth inner pin, and a fifth inner pin;

the first semiconductor switch and the second semiconductor switch are disposed on the metal bottom plate, and both a first terminal of the first semiconductor switch and a first terminal of the second semiconductor switch are coupled to the metal bottom plate;

a second terminal of the first semiconductor switch is coupled to the first inner pin, and a third terminal of the first semiconductor switch is coupled to the second inner pin;

a second terminal of the second semiconductor switch is coupled to the third inner pin, and a third terminal of the second semiconductor switch is coupled to the fourth inner pin; and the metal bottom plate is coupled to the fifth inner pin, and the metal bottom plate and each of the plurality of inner pins are integrally formed as part of a same lead frame, wherein the plurality of inner pins further comprise a sixth inner pin and a seventh inner pin, and the package structure further comprises:

a sixth outer pin coupled to the sixth inner pin; and a seventh outer pin coupled to the seventh inner pin, wherein the third terminal of the first semiconductor switch is further coupled to the sixth inner pin; and the third terminal of the second semiconductor switch is further coupled to the seventh inner pin; and the sixth inner pin and the seventh inner pin are both covered by a package housing, wherein the package housing is formed by plastically packaging the metal bottom plate and all of the plurality of inner pins by using a plastic package material; and the sixth outer pin and the seventh outer pin are both exposed outside the package housing.

2. The package structure according to claim 1, further comprising:

a first diode; and a second diode, wherein the first diode and the second diode are disposed on the metal bottom plate, and both a cathode of the first diode and a cathode of the second diode are coupled to the metal bottom plate; and an anode of the first diode is coupled to the second inner pin, and an anode of the second diode is coupled to the fourth inner pin.

3. The package structure according to claim 1, further comprising:

outer pins that are in a one-to-one correspondence with the inner pins; and any inner pin is coupled to an outer pin corresponding to the any inner pin; and all of the plurality of inner pins are covered by a package housing, wherein the package housing is formed by plastically packaging the metal bottom plate and all of the plurality of inner pins by using the plastic package material; and the outer pins that are in a one-to-one correspondence with the inner pins are exposed outside the package housing.

4. The package structure according to claim 1, further comprising:

a first outer pin coupled to the first inner pin;

a second outer pin coupled to the second inner pin;

a third outer pin coupled to the third inner pin; and a fourth outer pin coupled to the fourth inner pin, wherein the first inner pin, the second inner pin, the third inner pin, the fourth inner pin, and the fifth inner pin are all covered by a package housing; and the package housing is formed by plastically packaging the metal bottom plate and all of the plurality of inner pins by using the plastic package material; and the first outer pin, the second outer pin, the third outer pin, and the fourth outer pin are exposed outside the package housing; and a cutting surface of the fifth inner pin is exposed outside the package housing, and the cutting surface of the fifth inner pin is formed after a part that is of the fifth inner pin and that exceeds the package housing is cut off.

5. The package structure according to claim 1, wherein each of the plurality of inner pins is disposed along a first side surface of the metal bottom plate.

6. The package structure according to claim 1, wherein other inner pins than the fifth inner pin in the plurality of inner pins are disposed along a first side surface of the metal bottom plate, and the fifth inner pin is disposed along a second side surface of the metal bottom plate, wherein the first side surface is adjacent to the second side surface.

7. The package structure according to claim 1, wherein other inner pins than the fifth inner pin in the plurality of inner pins are disposed along a first side surface of the metal bottom plate, and the fifth inner pin is disposed along a third side surface of the metal bottom plate, wherein the first side surface is opposite to the third side surface.

8. The package structure according to claim 1, wherein pin widths of the first inner pin and the third inner pin are less than pin widths of the fifth inner pin, the second inner pin, and the fourth inner pin.

9. A bidirectional switch semiconductor device comprising a package housing and a chip having the package structure according to claim 1, and some of pins of the chip are exposed outside the package housing.

10. A power converter, wherein the power converter comprises a controller and a bidirectional switch semiconductor device package housing and a chip having the package comprising a metal bottom plate;

a first semiconductor switch;

a second semiconductor switch, and a plurality of inner pins, wherein the plurality of inner pins comprises a first inner pin, a second inner pin, a third inner pin, a fourth inner pin, and a fifth inner pin;

the first semiconductor switch and the second semiconductor switch are disposed on the metal bottom plate, and both a first terminal of the first semiconductor switch and a first terminal of the second semiconductor switch are coupled to the metal bottom plate;

a second terminal of the first semiconductor switch is coupled to the first inner pin, and a third terminal of the first semiconductor switch is coupled to the second inner pin;

a second terminal of the second semiconductor switch is coupled to the third inner pin, and a third terminal of the second semiconductor switch is coupled to the fourth inner pin; and the metal bottom plate is coupled to the fifth inner pin, and the metal bottom plate and each of the plurality of inner pins are integrally formed as part of a same lead frame; and the controller is configured to control turn-on or turn-off of the bidirectional switch semiconductor device to perform power conversion, wherein the plurality of inner pins further comprise a sixth inner pin and a seventh inner pin, and the package structure further comprises:

a sixth outer pin coupled to the sixth inner pin; and a seventh outer pin coupled to the seventh inner pin, wherein the third terminal of the first semiconductor switch is further coupled to the sixth inner pin;

and the third terminal of the second semiconductor switch is further coupled to the seventh inner pin; and the sixth inner pin and the seventh inner pin are both covered by the package housing, wherein the package housing is formed by plastically packaging the metal bottom plate and all of the plurality of inner pins by using a plastic package material; and the sixth outer pin and the seventh outer pin are both exposed outside the package housing.

11. The power converter according to claim 10, further comprising:

a first diode; and a second diode, wherein the first diode and the second diode are disposed on the metal bottom plate, and both a cathode of the first diode and a cathode of the second diode are coupled to the metal bottom plate; and an anode of the first diode is coupled to the second inner pin, and an anode of the second diode is coupled to the fourth inner pin.

12. The power converter according to claim 10, further comprising:

outer pins that are in a one-to-one correspondence with the inner pins; and any inner pin is coupled to an outer pin corresponding to the any inner pin; and all of the plurality of inner pins are covered by the package housing, wherein the package housing is formed by plastically packaging the metal bottom plate and all of the plurality of inner pins by using the plastic package material; and the outer pins that are in a one-to-one correspondence with the inner pins are exposed outside the package housing.

13. The power converter according to claim 10, further comprising:

a first outer pin coupled to the first inner pin;

a second outer pin coupled to the second inner pin;

a third outer pin coupled to the third inner pin; and a fourth outer pin coupled to the fourth inner pin, wherein the first inner pin, the second inner pin, the third inner pin, the fourth inner pin, and the fifth inner pin are all covered by the package housing; and the package housing is formed by plastically packaging the metal bottom plate and all of the plurality of inner pins by using the plastic package material; and the first outer pin, the second outer pin, the third outer pin, and the fourth outer pin are exposed outside the package housing; and a cutting surface of the fifth inner pin is exposed outside the package housing, and the cutting surface of the fifth inner pin is formed after a part that is of the fifth inner pin and that exceeds the package housing is cut off.

14. The power converter according to claim 10, wherein each of the plurality of inner pins is disposed along a first side surface of the metal bottom plate.

15. The power converter according to claim 10, wherein other inner pins than the fifth inner pin in the plurality of inner pins are disposed along a first side surface of the metal bottom plate, and the fifth inner pin is disposed along a second side surface of the metal bottom plate, wherein the first side surface is adjacent to the second side surface.

16. The power converter according to claim 10, wherein other inner pins than the fifth inner pin in the plurality of inner pins are disposed along a first side surface of the metal bottom plate, and the fifth inner pin is disposed along a third side surface of the metal bottom plate, wherein the first side surface is opposite to the third side surface.

17. The power converter according to claim 10, wherein pin widths of the first inner pin and the third inner pin are less than pin widths of the fifth inner pin, the second inner pin, and the fourth inner pin.

* * * * *